(12) United States Patent
Ujihara et al.

(10) Patent No.: US 10,896,909 B2
(45) Date of Patent: *Jan. 19, 2021

(54) INTEGRATED ASSEMBLIES, AND METHODS OF FORMING INTEGRATED ASSEMBLIES

(71) Applicant: Micron Technology, Inc., Boise, ID (US)

(72) Inventors: Shingo Ujihara, Hiroshima (JP); Hiroaki Taketani, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/440,897

(22) Filed: Jun. 13, 2019

(65) Prior Publication Data
US 2019/0326297 A1 Oct. 24, 2019

Related U.S. Application Data

(63) Continuation of application No. 15/957,589, filed on Apr. 19, 2018, now Pat. No. 10,347,639.

(51) Int. Cl.
*H01L 29/66* (2006.01)
*H01L 27/108* (2006.01)
(Continued)

(52) U.S. Cl.
CPC .. *H01L 27/10814* (2013.01); *H01L 21/02532* (2013.01); *H01L 21/30604* (2013.01);
(Continued)

(58) Field of Classification Search
CPC ......... H01L 27/10814; H01L 27/10826; H01L 27/10879; H01L 27/10885;
(Continued)

(56) References Cited

U.S. PATENT DOCUMENTS 8,039,340 B2 10/2011 Davis
8,461,640 B2 6/2013 Hu
(Continued)

FOREIGN PATENT DOCUMENTS

JP 2012-019035 A 1/2012
JP 2014-216327 A 11/2014
(Continued)

*Primary Examiner* — Calvin Y Choi
(74) *Attorney, Agent, or Firm* — Wells St. John P.S.

(57) ABSTRACT

Some embodiments include an integrated assembly having a first semiconductor material configured to comprise a pair of pedestals. The pedestals have upper regions which are separated from one another by a space, and have lower regions which join to one another at a floor region beneath the space. A second semiconductor material is configured as a bridge extending between the pedestals. The bridge is spaced from the floor region by a gap. The bridge has ends adjacent the pedestals, and has a body region between the ends. The body region has an outer periphery. Source/drain regions are within the pedestals, and a channel region is within the bridge. A dielectric material extends around the outer periphery of the body region of the bridge. A conductive material extends around the dielectric material. Some embodiments include methods of forming integrated assemblies.

14 Claims, 15 Drawing Sheets

(51) Int. Cl.
*H01L 29/06* (2006.01)
*H01L 29/08* (2006.01)
*H01L 29/10* (2006.01)
*H01L 29/165* (2006.01)
*H01L 29/16* (2006.01)
*H01L 23/528* (2006.01)
*H01L 21/306* (2006.01)
*H01L 21/02* (2006.01)
*H01L 29/423* (2006.01)
*H01L 29/786* (2006.01)

(52) U.S. Cl.
CPC ...... *H01L 23/528* (2013.01); *H01L 27/10826* (2013.01); *H01L 27/10879* (2013.01); *H01L 27/10885* (2013.01); *H01L 27/10888* (2013.01); *H01L 27/10891* (2013.01); *H01L 27/10894* (2013.01); *H01L 27/10897* (2013.01); *H01L 29/0649* (2013.01); *H01L 29/0673* (2013.01); *H01L 29/0847* (2013.01); *H01L 29/1033* (2013.01); *H01L 29/16* (2013.01); *H01L 29/165* (2013.01); *H01L 29/4236* (2013.01); *H01L 29/42392* (2013.01); *H01L 29/6653* (2013.01); *H01L 29/6656* (2013.01); *H01L 29/78696* (2013.01)

(58) Field of Classification Search
CPC ......... H01L 27/10888; H01L 27/10891; H01L 27/10894; H01L 27/10897; H01L 21/02532; H01L 21/30604; H01L 23/528; H01L 29/0649; H01L 29/0673; H01L 29/0847; H01L 29/1033; H01L 29/16; H01L 29/165; H01L 29/4236; H01L 29/42392; H01L 29/6653; H01L 29/6656; H01L 29/78696
USPC ...................................................... 257/192
See application file for complete search history.

(56) References Cited

U.S. PATENT DOCUMENTS

| | | | |
|---|---|---|---|
| 9,704,737 B2 | 7/2017 | Feng | |
| 2008/0150012 A1* | 6/2008 | Thies | G11C 7/02 257/329 |
| 2008/0272426 A1* | 11/2008 | Chae | H01L 21/28132 257/321 |
| 2012/0132971 A1 | 5/2012 | Mikasa | |
| 2012/0161227 A1 | 6/2012 | Oyu | |
| 2016/0336414 A1* | 11/2016 | Kang | H01L 29/66795 |

FOREIGN PATENT DOCUMENTS

| | | |
|---|---|---|
| TW | 201131786 | 9/2011 |
| TW | 201201320 | 1/2012 |
| TW | 201703155 | 1/2017 |
| TW | 107141586 | 2/2020 |
| TW | 107141586 | 3/2020 |
| WO | PCT/US2018/060986 | 3/2019 |

* cited by examiner

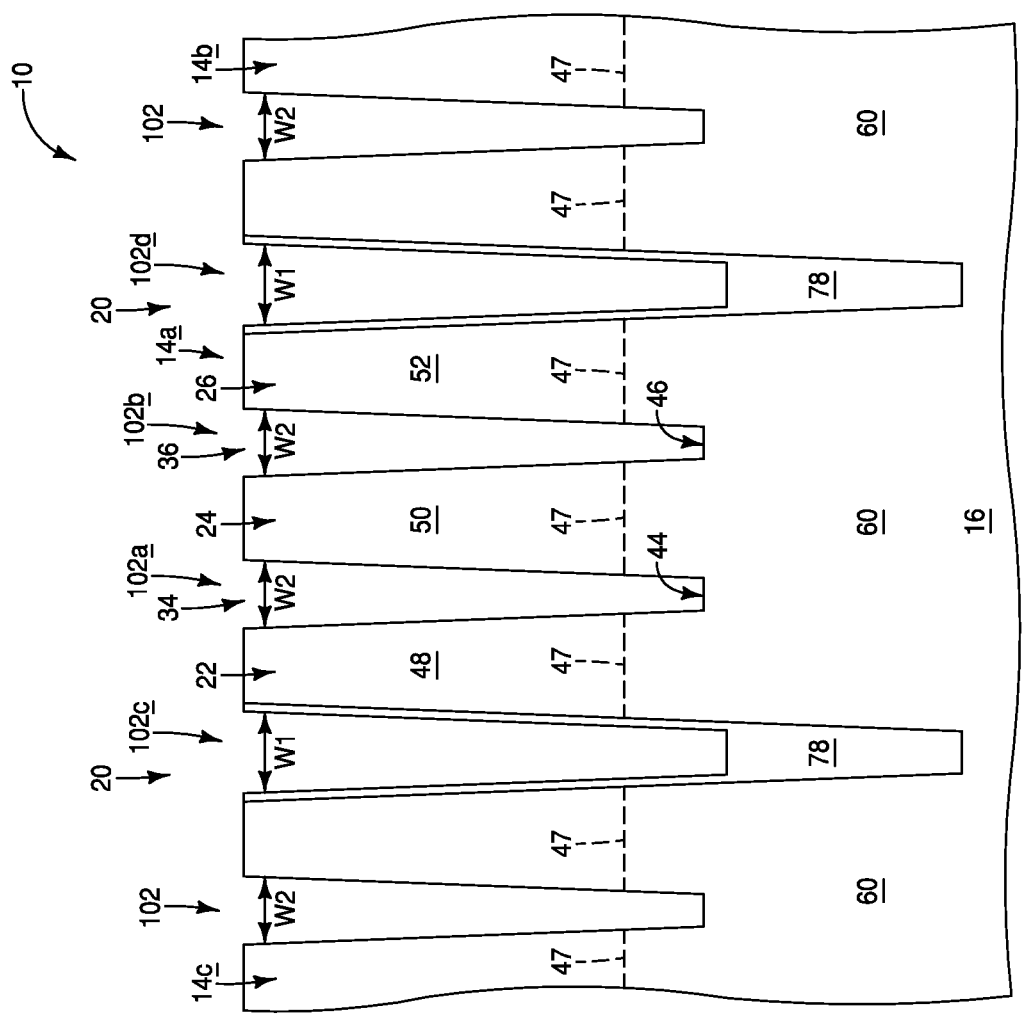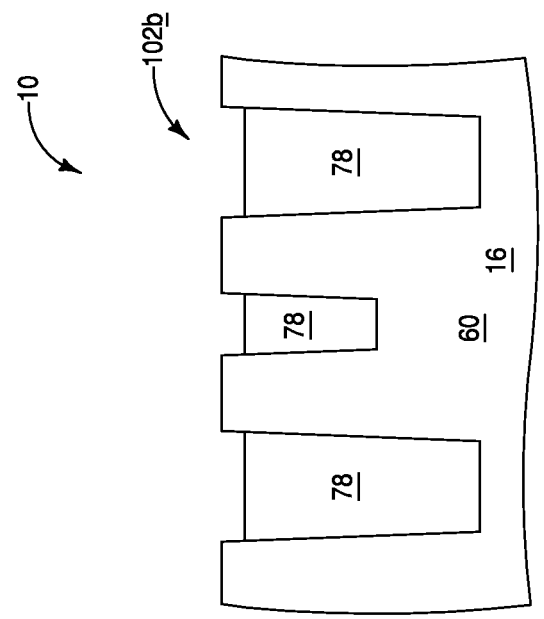

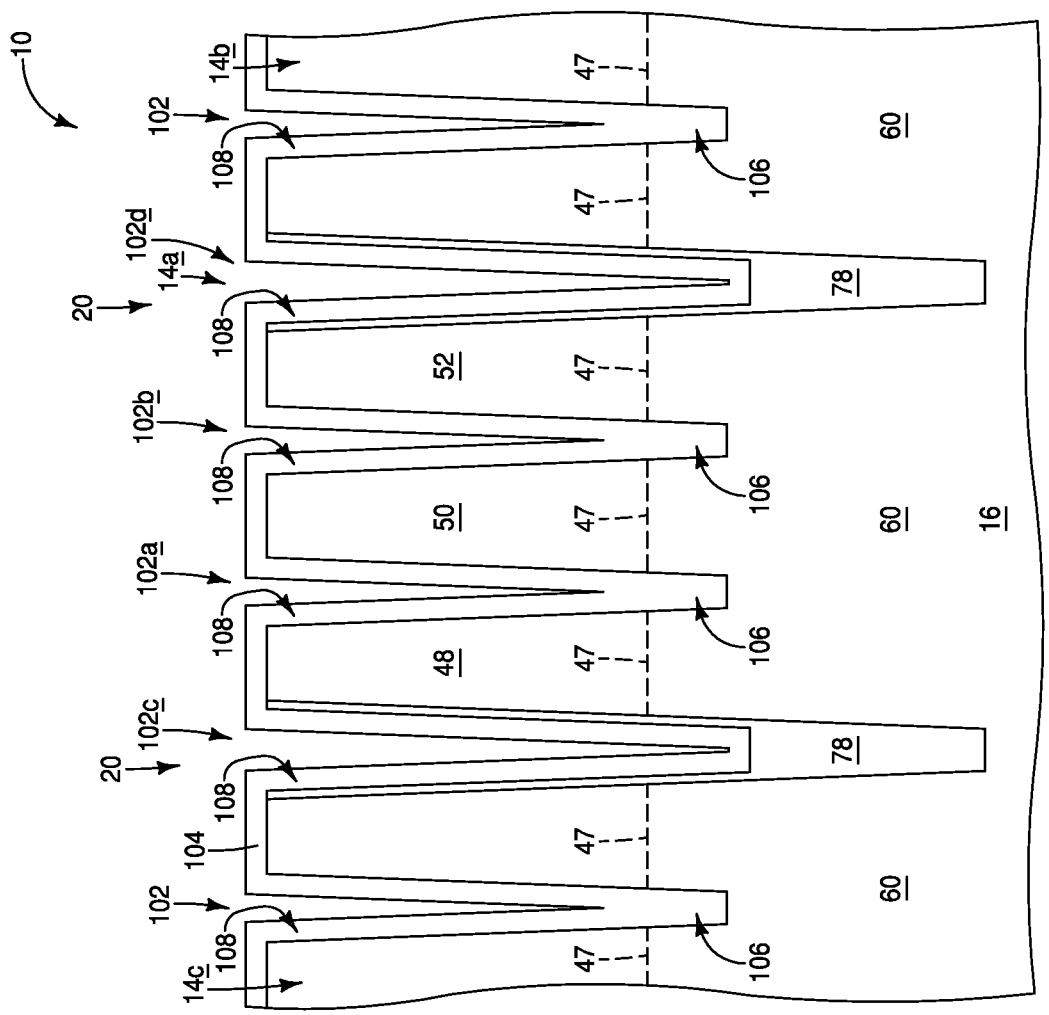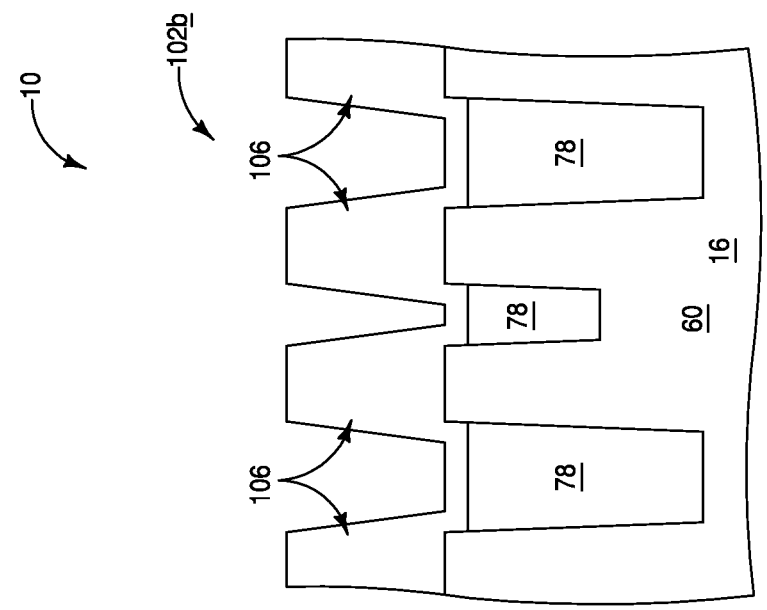
FIG. 5A
FIG. 5B

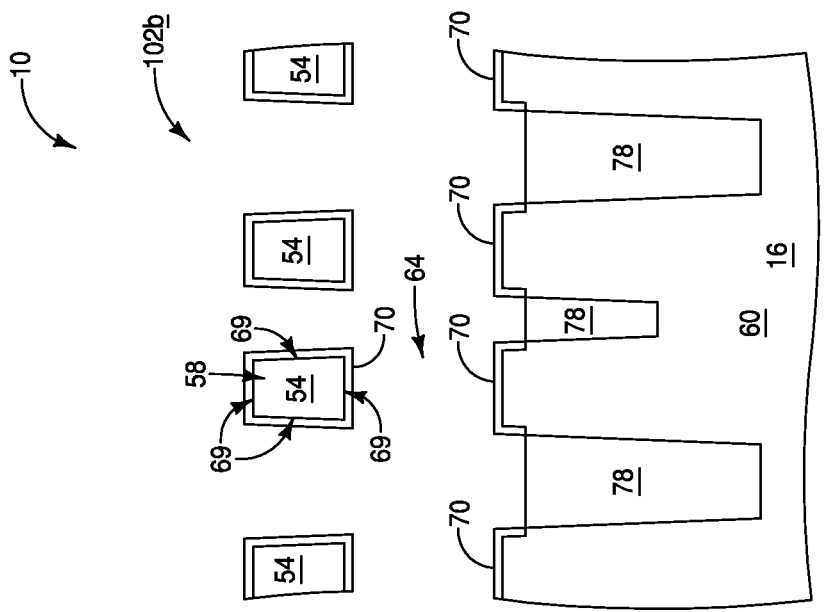
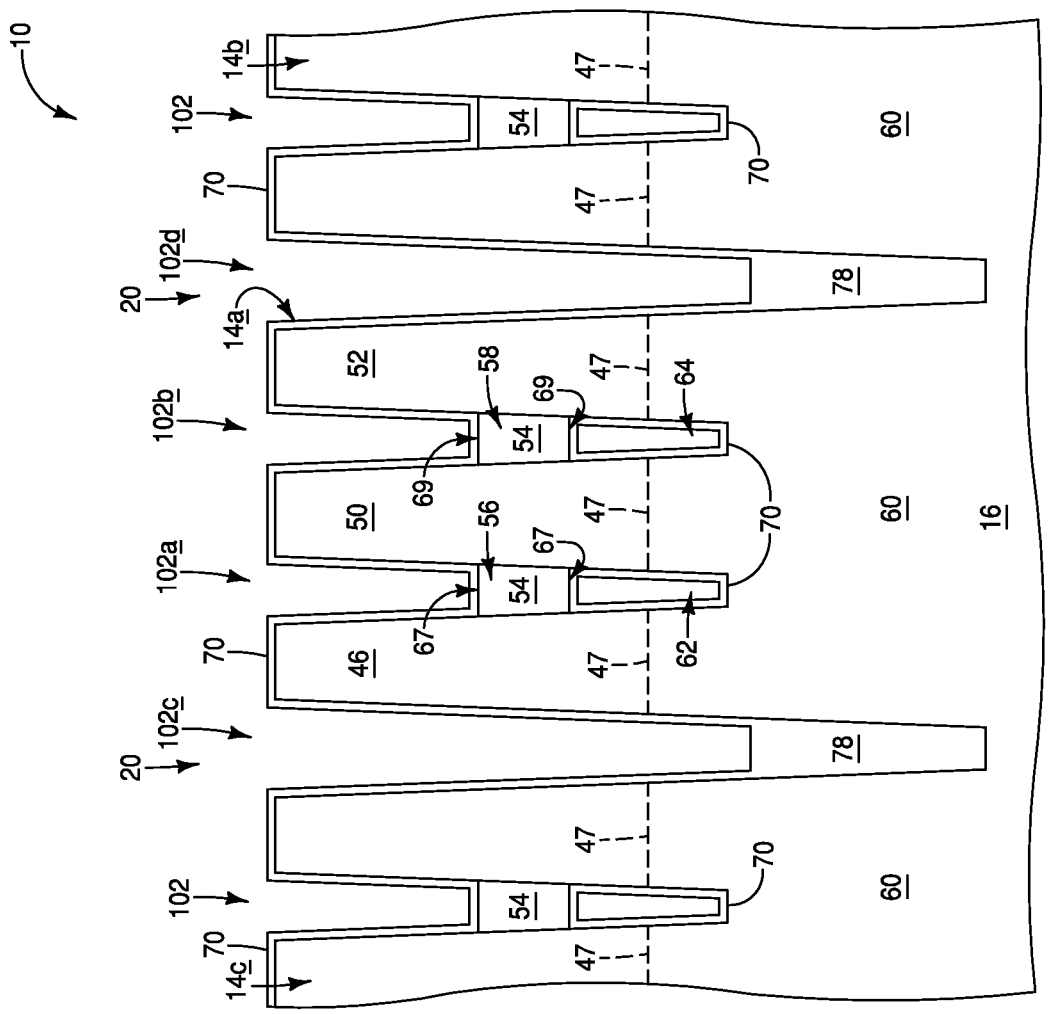
FIG. 10B
FIG. 10A

INTEGRATED ASSEMBLIES, AND METHODS OF FORMING INTEGRATED ASSEMBLIES

RELATED PATENT DATA

This application resulted from a continuation of U.S. patent application Ser. No. 15/957,589, filed Apr. 19, 2018, which is incorporated herein by reference.

TECHNICAL FIELD

Integrated assemblies (e.g., integrated memory), and methods of forming integrated assemblies.

BACKGROUND

Memory is one type of integrated circuitry, and is used in electronic systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

An example memory is dynamic random-access memory (DRAM). The DRAM unit cells may each comprise a capacitor in combination with a transistor. Charge stored on the capacitors of the DRAM unit cells may correspond to memory bits.

There is a continuing goal to improve architectural layouts of integrated circuit structures in an effort to maintain (or even improve) device performance, while achieving ever higher levels of integration. It is desired to develop improved architectures, and to develops methods of fabricating such improved architectures.

BRIEF DESCRIPTION OF THE DRAWINGS

FIG. 1 is a top view. FIG. 1B is a cross-sectional side view comprising a segment along the line B-B of FIG. 1, and along a line 1B-1B of FIG. 1A.

FIGS. 2A-13A are diagrammatic cross-sectional side views of the segment of FIG. 1A at example process stages which may be utilized during fabrication of the example assembly of FIG. 1; and FIGS. 2B-13B are diagrammatic cross-sectional side views of the segment of FIG. 1B at the example process stages which may be utilized during fabrication of the example assembly of FIG. 1.

DETAILED DESCRIPTION OF THE ILLUSTRATED EMBODIMENTS

Some embodiments include configurations in which active regions of second material are configured as fins extending upwardly from a base. Each fin may be subdivided amongst multiple pedestals. Bridges may extend between neighboring pedestals. Upper regions of the pedestals may comprise transistor source/drain regions, and the bridges may comprise transistor channel regions. Wordline material may encircle the bridges, and may comprise transistor gates adjacent the bridges. Example embodiments are described below with reference to FIGS. 1-14.

Figure 1:
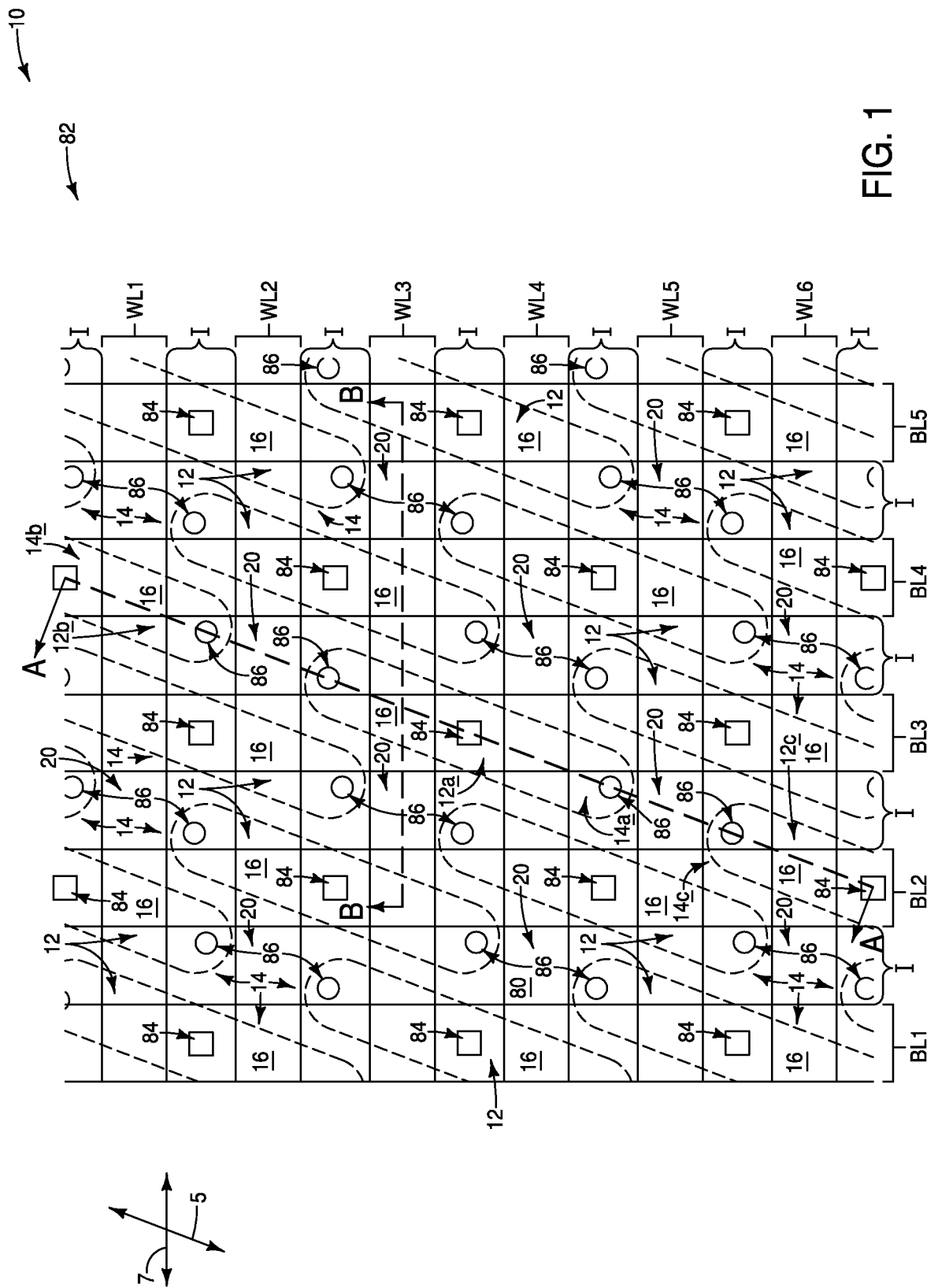
FIGS. 1-1B are diagrammatic views of a region of an example assembly comprising a portion of an example memory array.
Figure 1B:
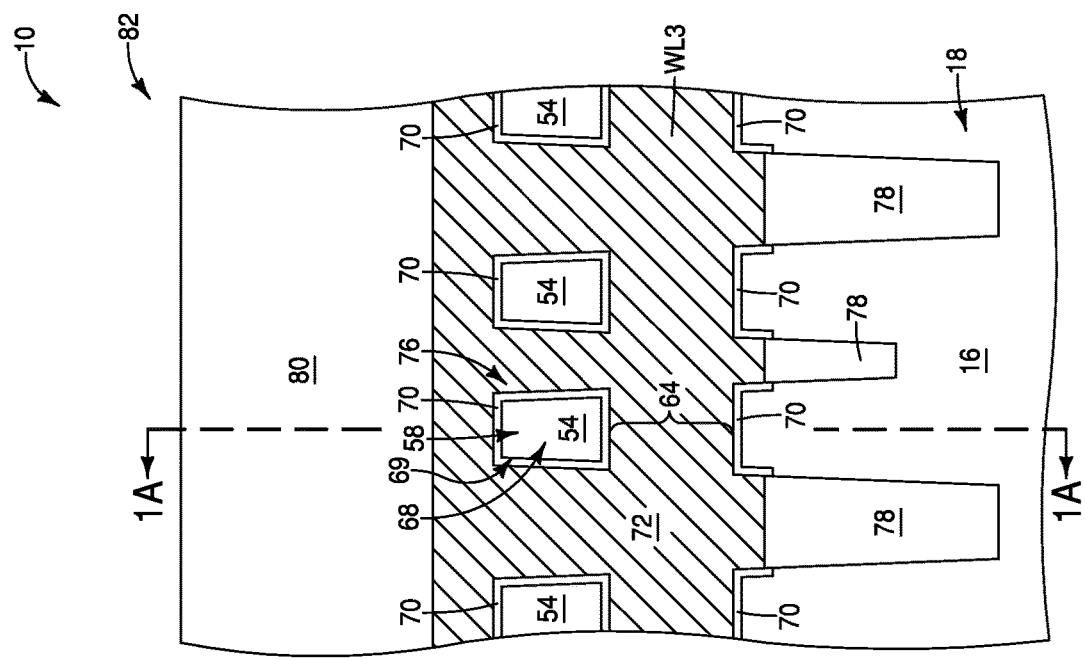
Figure 1A:
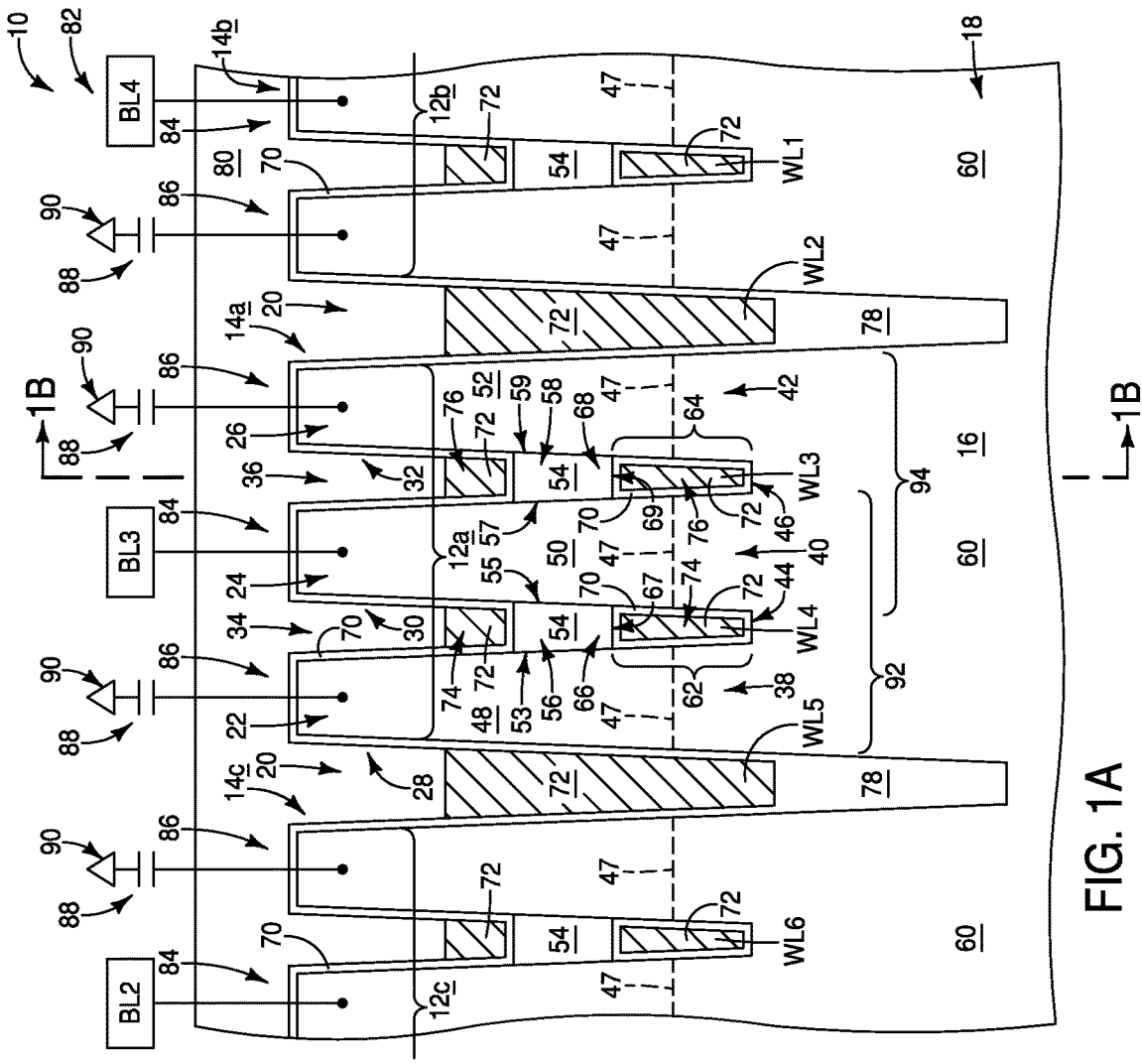
FIG. 1A is a cross-sectional side view comprising a segment along the line A-A of FIG. 1, and along a line 1A-1A of FIG. 1B.

Referring to FIGS. 1-1B, an integrated assembly (i.e., construction) 10 is shown in top view (FIG. 1), and a pair of cross-sectional side views (FIGS. 1A and 1B). The cross-sectional side view of FIG. 1A is along a segment A-A of FIG. 1. Such segment may be considered to correspond to a first plane which extends along a first direction represented by an axis 5 adjacent the top view of FIG. 1. The cross-sectional side view of FIG. 1B is along a segment B-B of FIG. 1. Such segment may be considered to correspond to a second plane which extends along a second direction represented by an axis 7 adjacent the top view of FIG. 1. The second direction of the axis 7 crosses the first direction of the axis 5.

The assembly 10 includes a plurality of active regions 12. Three of the active regions are along the cross-section of FIG. 1A, and such active regions are labeled 12a, 12b and 12c. The labeling of the active regions as 12a-c is utilized to enable such active regions to be distinguished during the discussion that follows, and does not indicate any differences relative to the other active regions 12. Outer edges of the active regions 12 are illustrated in dashed-line (i.e., phantom) view in the top view of FIG. 1 to indicate that the active regions are beneath other material (specifically, a material 80).

Each of the active regions comprises a fin 14 of semiconductor material 16, with such fin projecting upwardly from a base 18 (shown in the cross-sectional side views of FIGS. 1A and 1B). The fins of active regions 12a, 12b and 12c are labeled as 14a, 14b and 14c to enable such fins to be distinguished during the discussion that follows, and do not indicate any differences relative to the other fins 14.

The semiconductor material 16 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some example embodiments, the semiconductor material 16 may comprise, consist essentially of, or consist of silicon (e.g., monocrystalline silicon). The semiconductor material 16 may be referred to as a first semiconductor material to distinguish it from other semiconductor materials.

The base 18 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The active regions 12 are spaced from one another by intervening regions 20.

Each of the fins 14 of the active regions 12 are subdivided amongst multiple pedestals. In the shown embodiment, each of the active regions is subdivided amongst three pedestals; as shown in FIG. 1A relative to the active region 12a. The pedestals of active region 12a are labeled as a first pedestal 22, a second pedestal 24, and a third pedestal 26. The pedestals 22, 24 and 26 have upper regions 28, 30 and 32; respectively. The upper regions of the first and second pedestals 22 and 24 are spaced from one another by a first space 34, and the upper regions of the second and third pedestals 24 and 26 are spaced from one another by a second space 36.

The pedestals 22, 24 and 26 have lower regions 38, 40 and 42; respectively. The lower regions of the first and second pedestals 22 and 24 join to one another at a first floor region 44, and the lower regions of the second and third pedestals 24 and 26 join to one another at a second floor region 46. The first floor region 44 is beneath the first space 34, and the second floor region 46 is beneath the second space 36.

Dopant is provided within the fin 14a to form doped regions 48, 50 and 52 within the pedestals 22, 24 and 26, respectively. The doped regions 48, 50 and 52 may be n-type or p-type; and in some example embodiments will be appropriately doped to be suitable for utilization as source/drain regions. For instance, in some example embodiments the regions 48, 50 and 52 may be doped to a concentration of at least about 1×20 atoms/cm$^3$ with n-type dopant to form n-type conductively-doped source/drain regions.

Dashed lines 47 are provided to diagrammatically illustrate approximate boundaries between the doped regions 48, 50 and 52, and an underlying region 60 of the semiconductor material 16. The underlying region 60 may comprise any suitable dopant concentration; and in some embodiments may be background-doped with p-type dopant.

Semiconductor material 54 is provided between the pedestals 38, 40 and 42, and is configured as bridges 56 and 58. The bridge 56 extends between the first and second pedestals 22 and 24, and may be referred to as a first bridge. The bridge 58 extends between the second and third pedestals 24 and 26, and may be referred to as a second bridge.

The first bridge 56 is spaced from the first floor region 44 by a first gap 62, and the second bridge 58 is spaced from the second floor region 46 by a second gap 64.

The bridge 56 has a first end 53 adjacent the first pedestal 22, and has a second end 55 adjacent the second pedestal 24. Similarly, the bridge 58 has a first end 57 adjacent the second pedestal 24, and has a second end 59 adjacent the third pedestal 52.

The first bridge 56 has a body region 66 between the first and second ends 53 and 55; and the second bridge 58 has a body region 68 between the first and second ends 57 and 59. The body regions 66 and 68 may be referred to as first and second body regions, respectively.

The first body region 66 has an outer periphery 67 which surrounds the first body region; and the second body region 68 has an outer periphery 69 which surrounds the second body region.

The semiconductor material 54 of bridges 56 and 58 may be referred to as second semiconductor material to distinguish it from the first semiconductor material 16. The second semiconductor material 54 may comprise any suitable composition(s); and in some embodiments may comprise, consist essentially of, or consist of one or more of silicon, germanium, III/V semiconductor material (e.g., gallium phosphide), semiconductor oxide, etc. The second semiconductor material 54 may comprise a same composition as the first semiconductor material 16, or may comprise a different composition relative to the first semiconductor material. In some embodiments, the semiconductor materials 16 and 54 may both comprise, consist essentially of, or consist of silicon.

The semiconductor material 54 may be referred to as bridge material. The bridge material 54 may be appropriately doped form channel regions. For instance, if the doped regions 48, 50 and 52 are n-type doped source/drain regions, the bridge material 54 may be doped with p-type dopant to a desired threshold voltage level.

Dielectric material 70 is provided to line the gaps 62 and 64 beneath the bridges 56 and 58, and to line the spaces 34 and 36 over the bridges 56 and 58. The dielectric material 70 extends entirely around the outer peripheries 67 and 69 of the first and second bridges 56 and 58.

The dielectric material 70 may comprise any suitable composition or combination of compositions; and in some embodiments may comprise, consist essentially of, or consist of silicon dioxide. In some embodiments, the dielectric material 70 may be referred to as gate dielectric material.

Conductive material 72 is provided within the spaces 34 and 36 over the bridges 56 and 58, and within the gaps 62 and 64 under the bridges 56 and 58.

The conductive material 72 forms wordlines WL1, WL2, WL3, WL4, WL5 and WL6 along the illustrated portion of assembly 10. Regions of the wordlines are visible in the cross-sectional views of FIGS. 1A and 1B. The wordlines are diagrammatically illustrated with simple lines relative to the top view of FIG. 1 to represent locations of the wordlines since the wordlines are not actually visible in such top view and instead are beneath other materials.

The conductive material 72 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 72 may comprise metal; such as, for example, tungsten.

The conductive material 72 includes transistor gates 74 and 76 in regions proximate the bridges 56 and 58. Such transistor gates gatedly couple source/drain regions through the channel regions of the bridges. For instance, the transistor gate 74 gatedly couples the source/drain regions 48 and 50 through the channel region of bridge 56; and the transistor gate 76 gatedly couples the source/drain regions 50 and 52 through the channel region of bridge 58.

It is to be understood that the source/drain regions (e.g., regions 48, 50 and 52) may be formed to any suitable depth. The approximate depth represented by the dashed line 47 is an example of an embodiment in which the source/drain regions extend to beneath the channel regions within the bridges (e.g. 56 and 58). As another example, the source/drain regions may extend to about the elevational level of the upper surfaces of such bridges rather than extending to beneath such bridges.

FIG. 1A shows that the wordlines WL3 and WL4 pass through the active region 12a, whereas the wordlines WL2 and WL5 pass along outer edges of such active region. The wordlines WL2 and WL5 are within the intervening regions 20. The wordlines are isolated from the semiconductor material of the fin 14a with insulative material 78. Such insulative material may comprise any suitable composition or combination of compositions; and in some embodiments may comprise, consist essentially of, or consist of silicon dioxide. The insulative material 78 is shown merging with the insulative material 70, as would occur if the materials 70 and 78 are a same composition as one another. In other embodiments, the materials 70 and 78 may be different compositions relative to one another.

An insulative capping material 80 is over the conductive wordline material 72. The insulative capping material 80 may comprise any suitable composition or combination of compositions; and in some embodiments may comprise, consist essentially of, or consist of silicon nitride.

The active regions 12 are incorporated into a memory array 82. Such memory array may be, for example, a dynamic random-access memory (DRAM) array.

The wordlines WL1-WL6 extend along rows of the memory array 82. Bitlines BL1-BL5 extend along columns of the illustrated portion of the memory array 82. The bitlines are diagrammatically illustrated with simple lines relative to the top view of FIG. 1 to show approximate locations of the bitlines relative to other materials, and are diagrammatically represented with boxes relative to the cross-sectional side views of FIGS. 1A and 1B.

The top view of FIG. 1 shows the wordlines WL1-WL6 spaced from one another with insulative regions "I", and shows the bitlines BL1-BL5 also spaced from one another with the insulative regions "I".

The central pedestals within each of the fins 14 (e.g., the pedestal 24 within the fin 14a) are coupled with the bitlines through bitline contact locations 84 (diagrammatically indicated with squares in the top view of FIG. 1), and the outer pedestals of the fins (e.g., the pedestals 22 and 26 of fin 14a) are coupled with capacitors 88 (shown in FIG. 1A) through capacitor contact locations 86 (diagrammatically indicated with circles in the top view of FIG. 1). The capacitors 88 are examples of charge-storage devices, and in other embodiments the capacitors may be replaced with other suitable charge-storage devices.

The capacitors 88 are shown in FIG. 1A to have one node coupled with a source/drain region (e.g., the source/drain regions 48 and 52 of the fin 14a), and to have another node coupled with a reference voltage 90. The reference voltage 90 may be ground, or any other suitable voltage (e.g., a so-called common plate voltage (CP)).

In some embodiments, each fin 14 may be considered to comprise a pair of access transistors; with access transistors 92 and 94 being diagrammatically illustrated relative to the fin 14a. The access transistor 92 may be referred to as a first access transistor; and comprises the first pedestal 22, the second pedestal 24, and the bridge 56 between the pedestals 22 and 24. The access transistor 94 may be referred to as a second access transistor; and comprises the second pedestal 24, the third pedestal 26, and the bridge 58 between the second and third pedestals. The access transistors 92 and 94 may be utilized for accessing the capacitors 88 during operation of the memory array 82. Individual memory cells may comprise a capacitor and an associated access transistor, as described in more detail below with reference to FIG. 14.

In some embodiments, the integrated assembly 10 of FIGS. 1-1B may be considered to comprise a memory cell array 82. The memory cell array comprises a plurality of buried wordlines (e.g., WL3), a plurality of bitlines (e.g., BL3) and a plurality of memory cells (e.g., memory cells of the type described below with reference to FIG. 14 as memory cells 202), each of the plurality of memory cells is coupled to an associated one of the plurality of buried wordlines (e.g., WL3) and an associated one of the bitlines (e.g., BL3) and comprises an access device (e.g., 92). The access device comprises a pair of source/drain regions (e.g., 48 and 50) and a gate electrode (e.g., 74). The gate electrode comprises a part of an associated one of the plurality of buried wordlines (e.g., WL4), and intervenes between the pair of source/drain regions (e.g., 48 and 50). A hole penetrates through the part of the associated one of the plurality of buried wordlines (an example hole may be considered to correspond to a region comprised by material 56, with such material penetrating through the wordline WL4). A channel region in the hole couples the pair of the source/drain regions to each other (with the "channel region in the hole" being, for example, a channel region within material 56).

The fins 14 and the associated access transistors (e.g., access transistors 92 and 94) may be fabricated with any suitable processing. Example processing is described with reference to FIGS. 2A-13A and 2B-13B. The cross-sections of FIGS. 2A-13A correspond to the same plane as shown along the cross-section of FIG. 1A; and the cross-sections of FIGS. 2B-13B correspond to the same plane as shown along the cross-section of FIG. 1B.

Figure 2B:
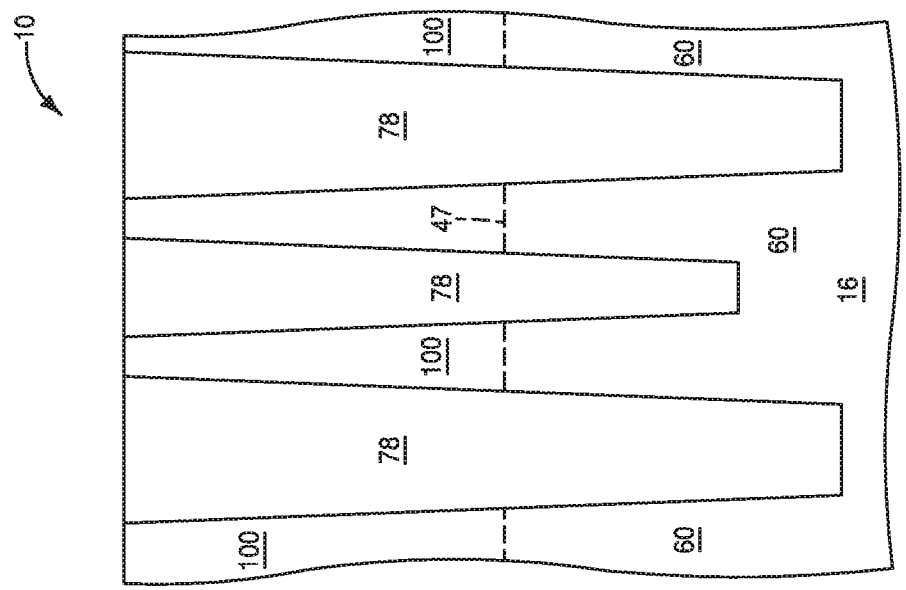
Figure 2A:
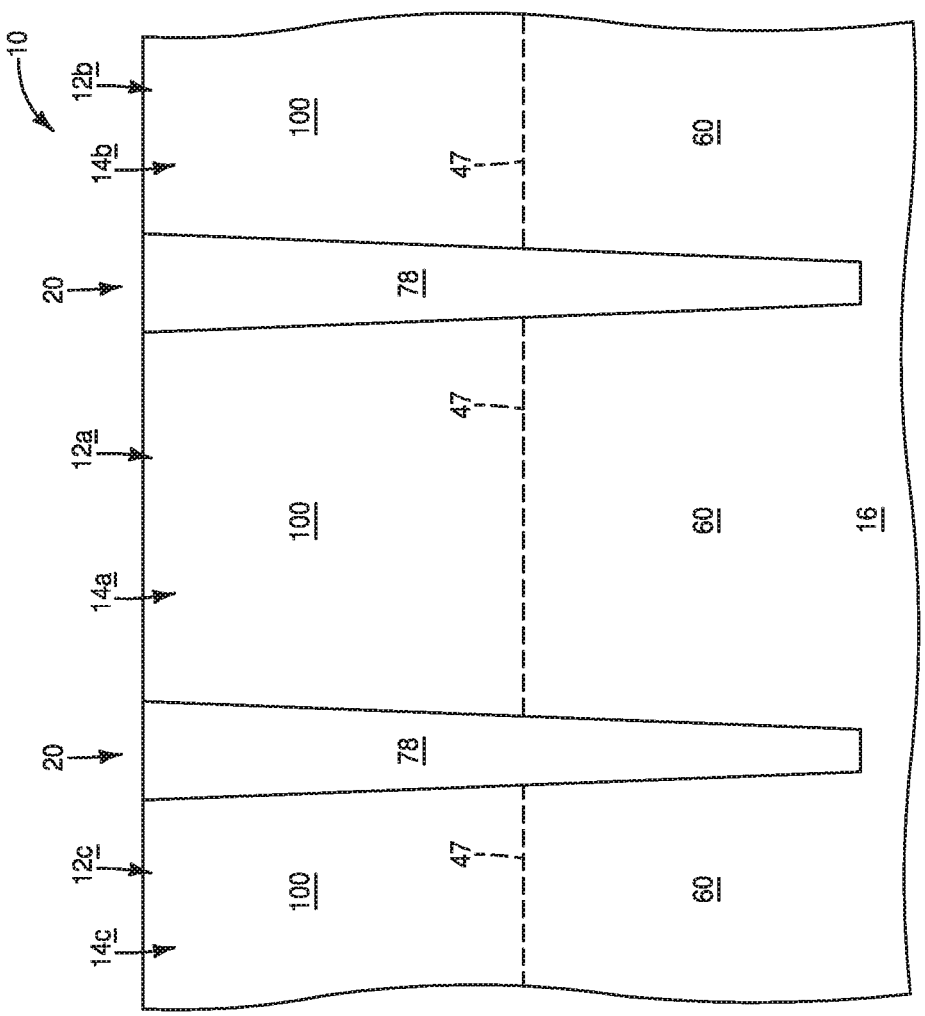

Referring to FIGS. 2A and 2B, assembly 10 is shown at a processing stage after dopant is provided within the semiconductor material 16 to form an upper doped region 100 over the lower doped region 60. The dashed line 47 is provided to diagrammatically illustrate an approximate boundary between the upper doped region 100 and the lower doped region 60.

Insulative material 78 is provided within the intervening regions 20 to separate the fins 14a, 14b and 14c from one another. The separated fins correspond to the active regions 12a, 12b and 12c.

Figure 3B:
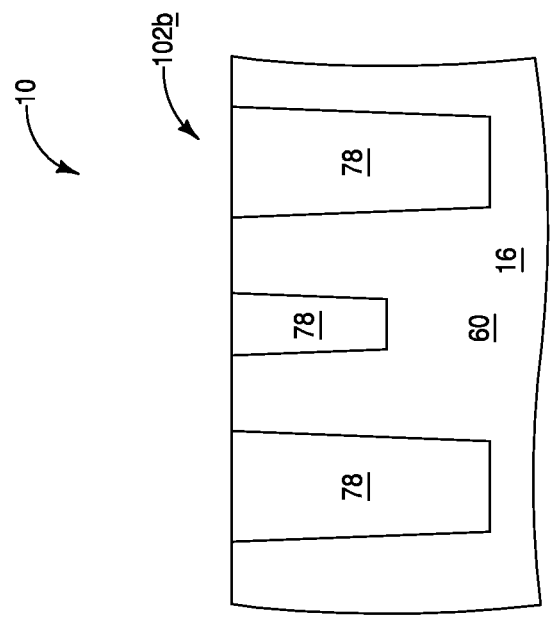
Figure 3A:
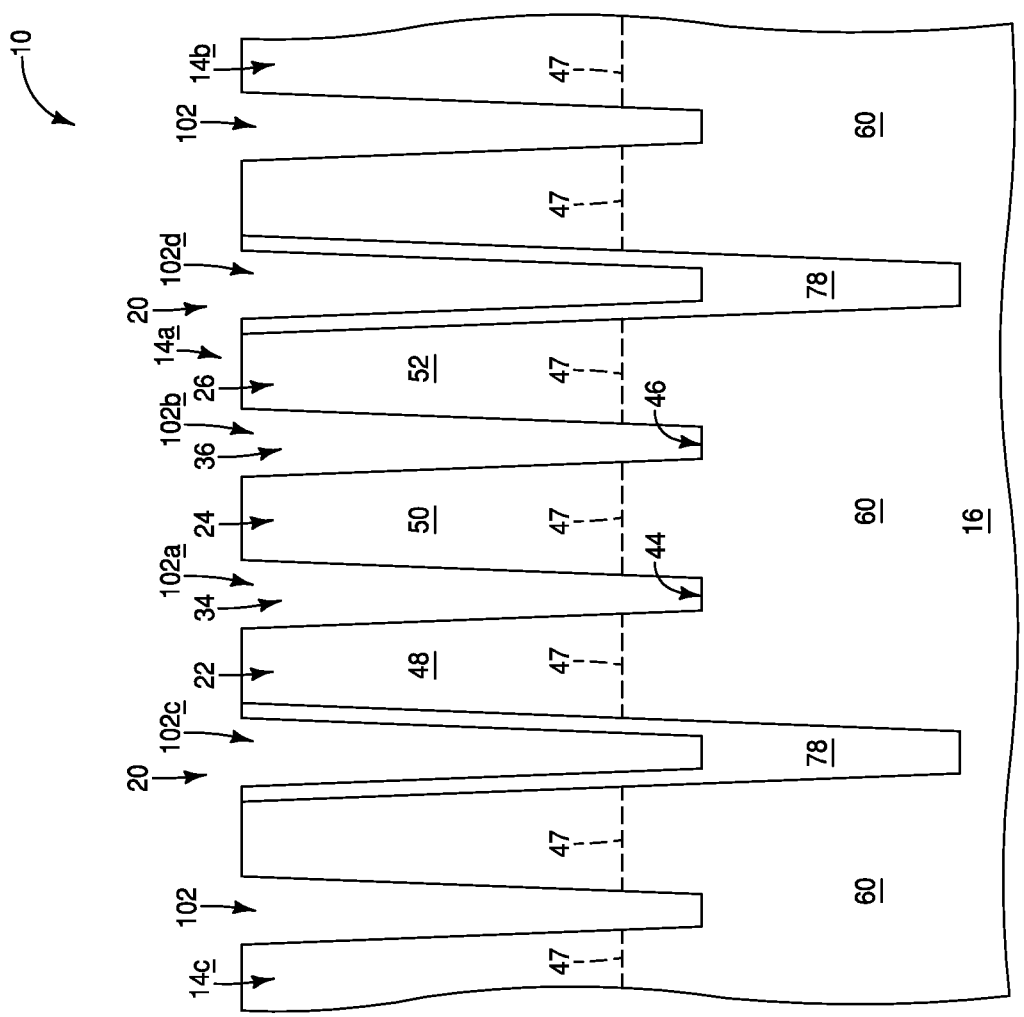

Referring to FIGS. 3A and 3B, trenches 102 are etched into the semiconductor material 16. Such trenches subdivide upper portions of each of the fins 14 amongst three pedestals (e.g., the pedestals 22, 24 and 26 within the fin 14a). The trenches include the spaces between the upper regions of the pedestals (e.g., the spaces 34 and 36) which are described above with reference to FIGS. 1-1B. The doped region 100 (FIGS. 2A and 2B) is patterned amongst the pedestals to become the source/drain regions within the pedestals (e.g., the source/drain regions 48, 50 and 52 within the pedestals 22, 24 and 26).

The cross-section of FIG. 3A shows a pair of the trenches 102 extending through the fin 14a (the active region 12a). Such trenches may be referred to as a first trench 102a and a second trench 102b. The cross-section of FIG. 3A also shows a pair of trenches passing along outer edges of the fin 14a (i.e., the active region 12a). Such trenches may be referred to as a third trench 102c and a fourth trench 102d. In the shown embodiment, the first and second trenches 102a and 102b extend into the semiconductor material 16, and the third and fourth trenches 102c and 102d extend into the insulative material 78 of the intervening regions 20. The insulative material 78 forms liners along interior peripheral edges of the third and fourth trenches 102c and 102d.

Lower regions of the first and second pedestals 22 and 24 join to one another at a bottom surface of the first trench 102a corresponding to the first floor region 44, and lower regions of the second and third pedestals 24 and 26 join to one another at a bottom surface of the second trench 102b corresponding to the second floor region 46.

Referring to FIGS. 4A and 4B, the trenches within the intervening regions 20 (e.g., trenches 102c and 102d) are widened relative to the other trenches. Such widening may be accomplished utilizing an oxide etch in embodiments in which the insulative material 78 comprises silicon dioxide. The processing of FIGS. 4A and 4B may be omitted if the trenches within the isolation regions (e.g., trenches 102c and 102d) are wider as a natural result of the processing utilized to form the trenches 102. The widened trenches are shown to have a width W1, and the narrower trenches are shown to have a width W2. The width W2 is less than the width W1; and in some embodiments may be less than or equal to about one half of the width W1.

Referring to FIGS. 5A and 5B, spacer material 104 is deposited within the trenches 102 and over the semiconductor material 16. The spacer material is deposited to a suitable thickness such that it fills bottom regions of the narrower trenches (e.g., the first and second trenches 102a and 102b) to form spacers 106, but does not form comparable spacers within the wider trenches (e.g., the third and fourth trenches 102c and 102d). Instead, the spacer material 104 forms liners 108 along inner peripheries of the wider trenches. The spacer material 104 also forms the liners 108 in the narrower trenches along upper regions which are above the spacers 106. The liners 108 may be referred to as first liners to distinguish them from other liners formed at subsequent process stages.

The spacer material 104 may be formed in the shown configuration by depositing the spacer material to a suitable thickness such that the spacer material pinches off within the bottoms of the narrower trenches (e.g., the first and second trenches 102a and 102b), but does not pinch off within the bottoms of the wider trenches (e.g., the third and fourth trenches 102c and 102d).

The spacer material 104 may comprise any suitable composition(s); and in some embodiments may comprise, consist essentially of, or consist of silicon dioxide. In some embodiments, the spacer material 104 and the insulative material 78 may both comprise silicon dioxide. However, the spacer material 104 may be formed to a lower density than the insulative material 78 so that the spacer material 104 may be selectively etched relative to the insulative material 78.

Although the spacers 106 are shown to have sharp upper corners along the illustrated cross-section of FIG. 5B, it is to be understood that in actual practice such upper corners may be rounded.

Figure 6B:
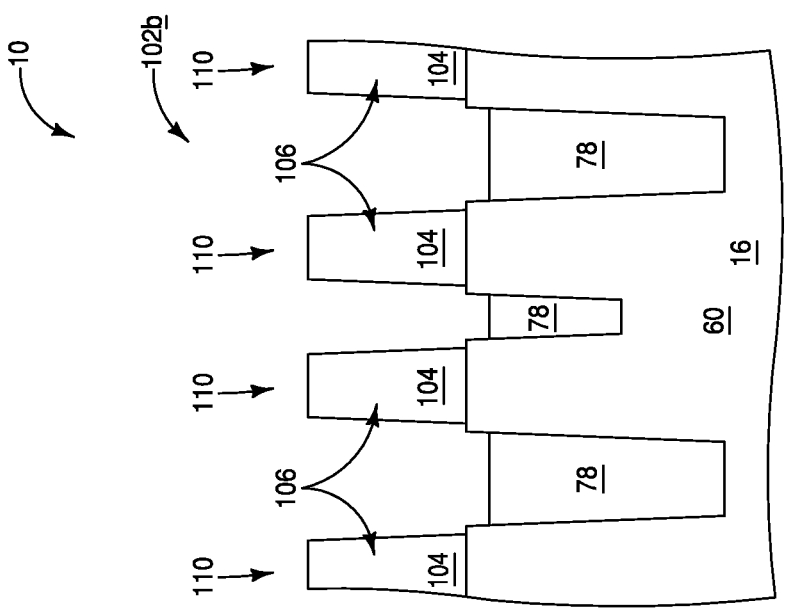
Figure 6A:
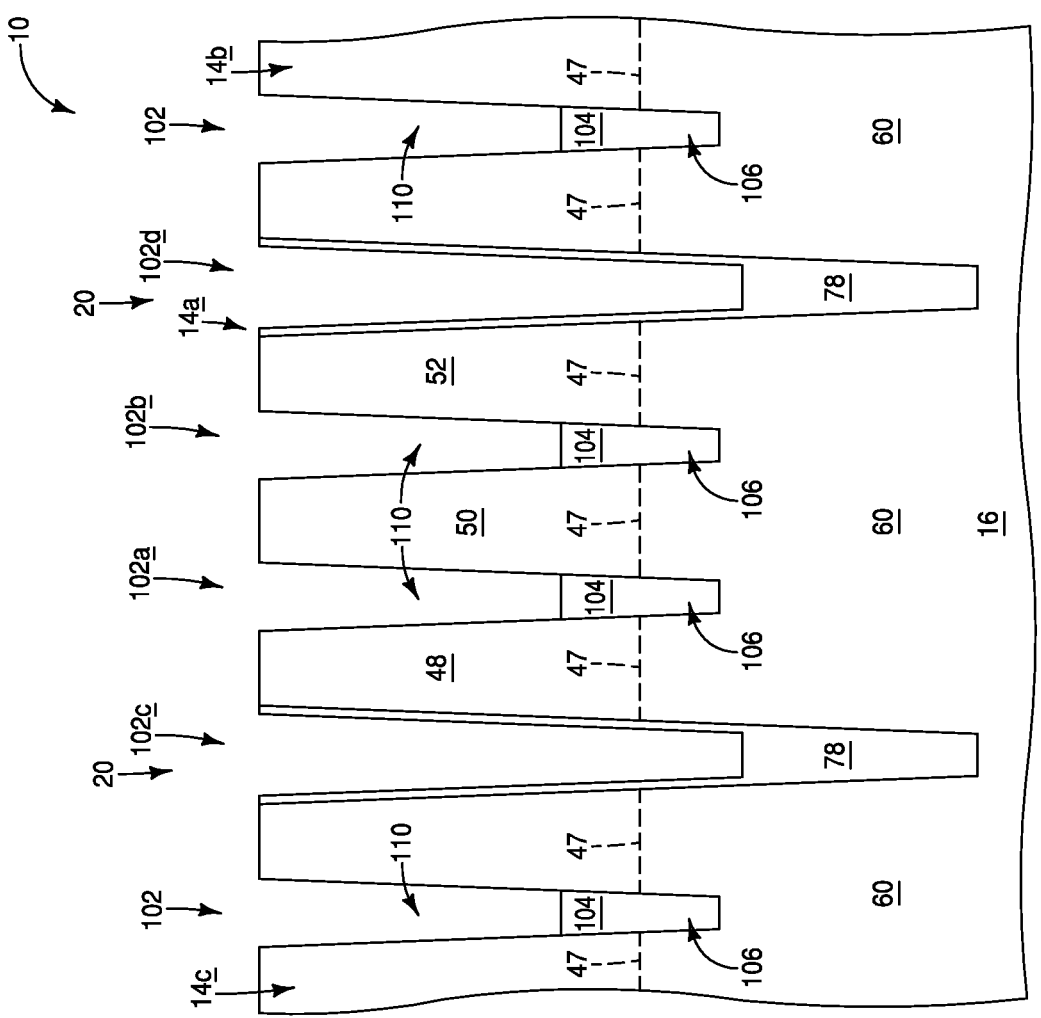

Referring to FIGS. 6A and 6B, the spacer material 104 is selectively etched relative to the insulative material 78 to remove the liners 108 (FIGS. 5A and 5B), while leaving the spacers 106 within the bottoms of the narrower trenches (e.g., the first and second trenches 102a and 102b). The spacers 106 fill the bottoms of the narrower trenches, while leaving remaining regions 110 of the narrower trenches over such spacers.

Figure 7B:
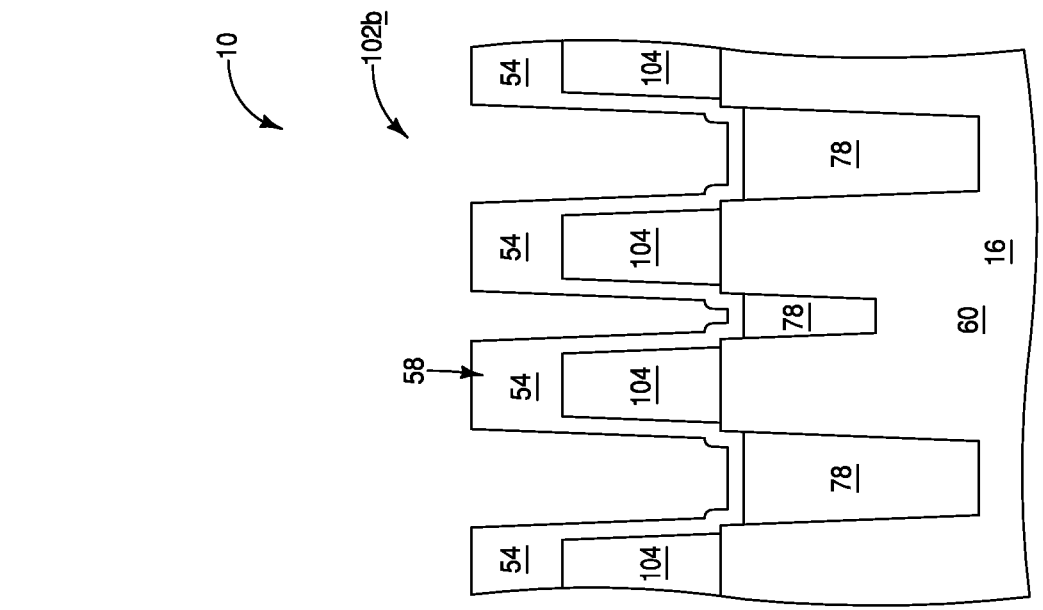
Figure 7A:
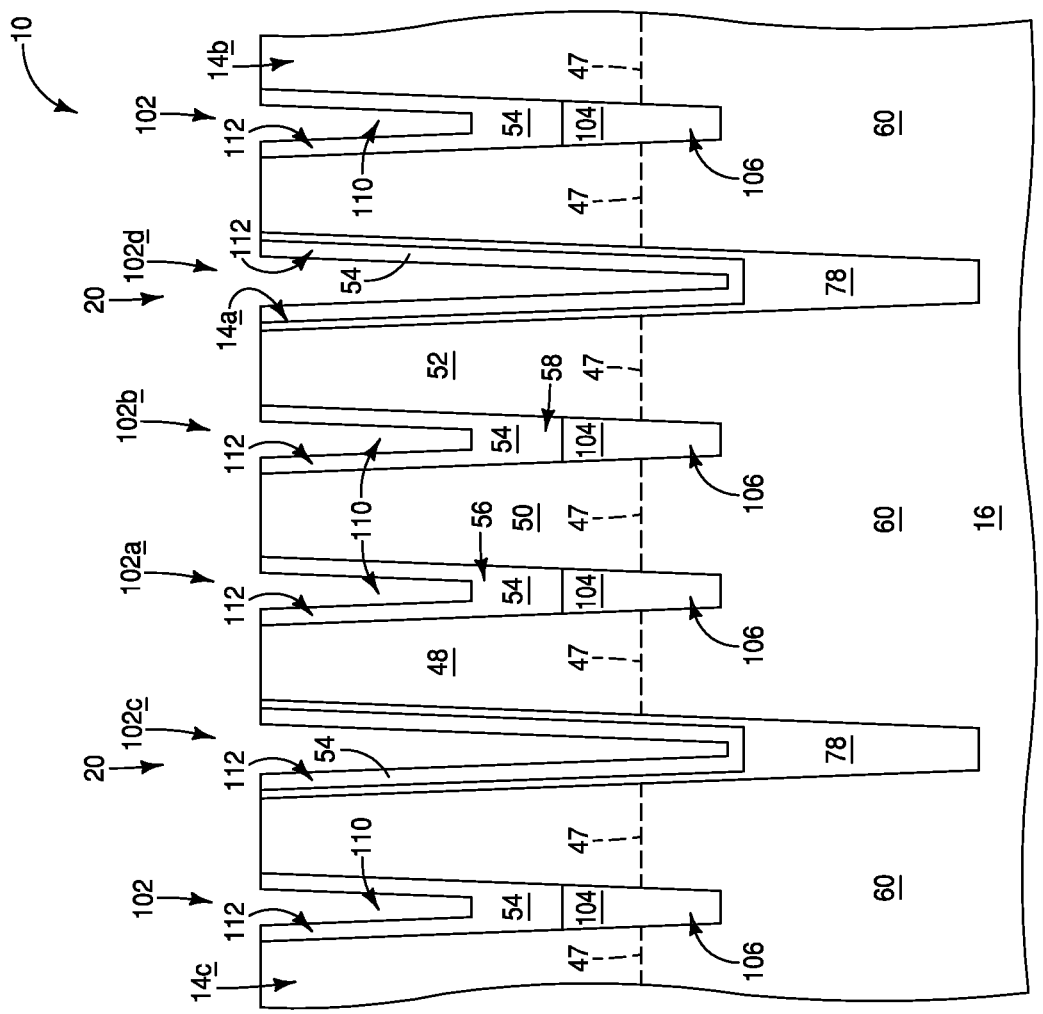

Referring to FIGS. 7A and 7B, semiconductor material 54 is formed within the trenches 102. The semiconductor material 54 may be deposited within the trenches 102 and/or may be epitaxially grown from exposed surfaces of the semiconductor material 16. In the shown embodiment, the semiconductor material 54 has been removed from across a top of the semiconductor material 16. Such removal may be accomplished utilizing planarization (e.g., chemical mechanical polishing) or other suitable processing.

The semiconductor material 54 is deposited to a suitable thickness such that it fills bottom portions of the remaining regions 110 of the narrower trenches (e.g., the first and second trenches 102a and 102b) to form the bridges (e.g., bridges 56 and 58) within the narrower trenches, but does not form comparable bridges within the wider trenches (e.g., the third and fourth trenches 102c and 102d). Instead, the semiconductor material 54 forms liners 112 along inner peripheries of the wider trenches. The semiconductor material 54 also forms the liners 112 in the narrower trenches along upper regions which are above the bridges (e.g., bridges 56 and 58). The liners 112 may be referred to as second liners to distinguish them from the first liners 108 (FIGS. 5A and 5B). The liners 112 comprise the semiconductor material 54, and accordingly may be referred to as semiconductor material liners.

The semiconductor material 54 may be formed into the shown configuration by depositing the semiconductor material to a suitable thickness such that the semiconductor material pinches off within the bottoms of the remaining regions 110 of the narrower trenches (e.g., the first and second trenches 102a and 102b), but does not pinch off within the bottoms of the wider trenches (e.g., the third and fourth trenches 102c and 102d).

Figure 8B:
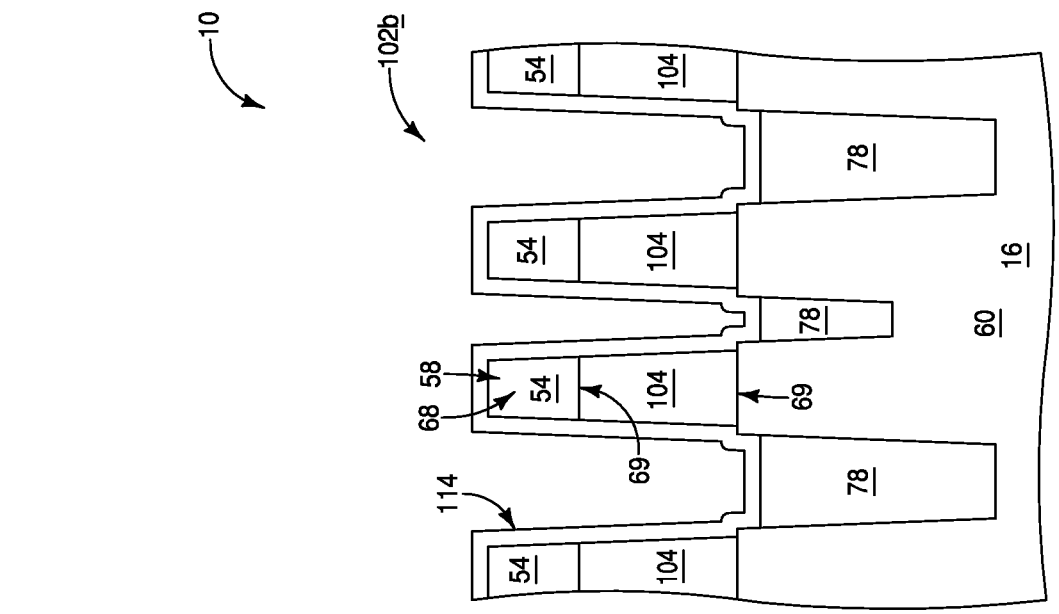
Figure 8A:
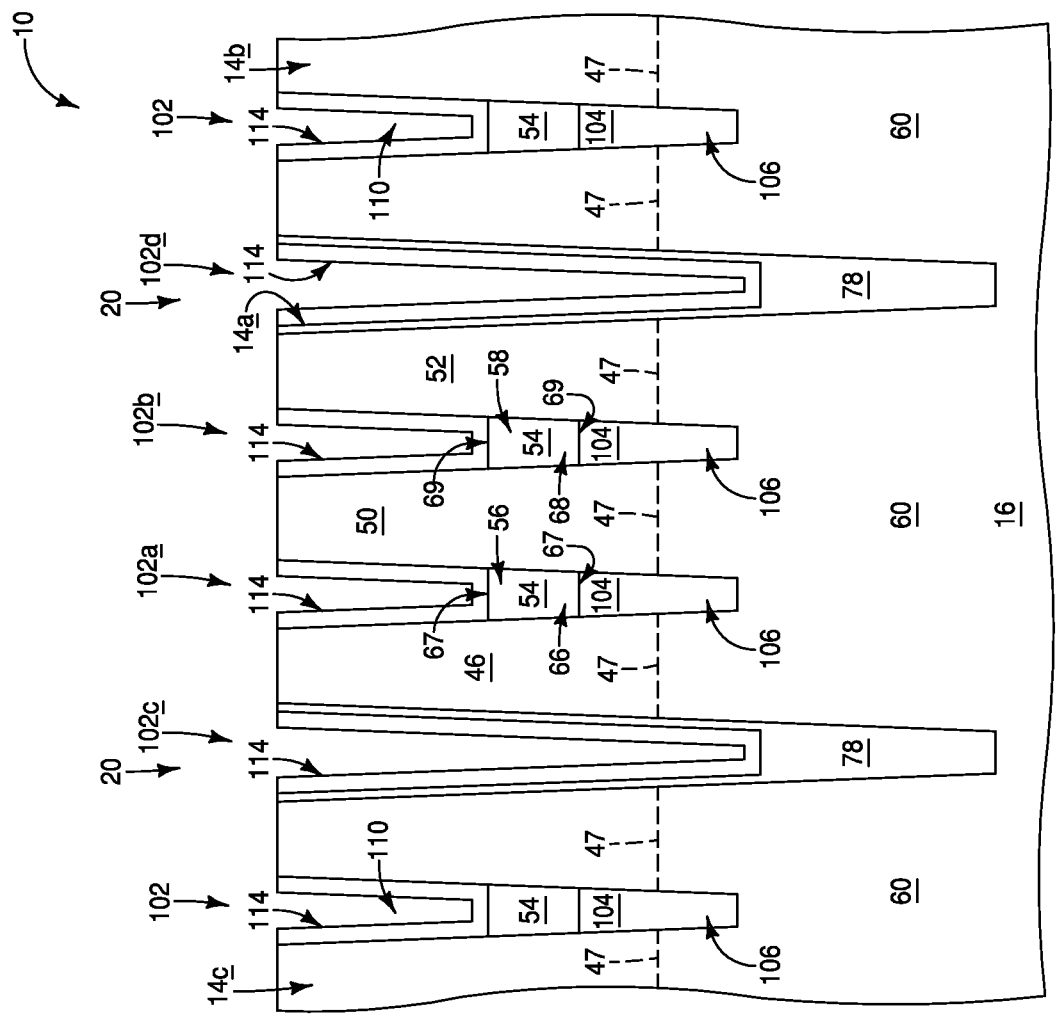

Referring to FIGS. 8A and 8B, outer surfaces of the semiconductor material 54 are oxidized to convert the semiconductor material liners 112 into oxide liners 114. For instance, if the semiconductor material 54 comprises silicon, the oxide liners 114 may comprise silicon dioxide.

The bridges (e.g., bridges 56 and 58) remain under the liners 114 within the narrower trenches (e.g., the first and second trenches 102a and 102b). Such bridges comprise body regions (e.g., body regions 66 and 68 of the bridges 56 and 58). Each of the bridge body regions has an outer periphery (e.g., the first body region 66 has an outer periphery 67; and the second body region 68 has an outer periphery 69). Channel material dopant may be implanted into the bridge body regions (e.g., the body regions 66 and 68 of the bridges 56 and 58).

Figure 9B:
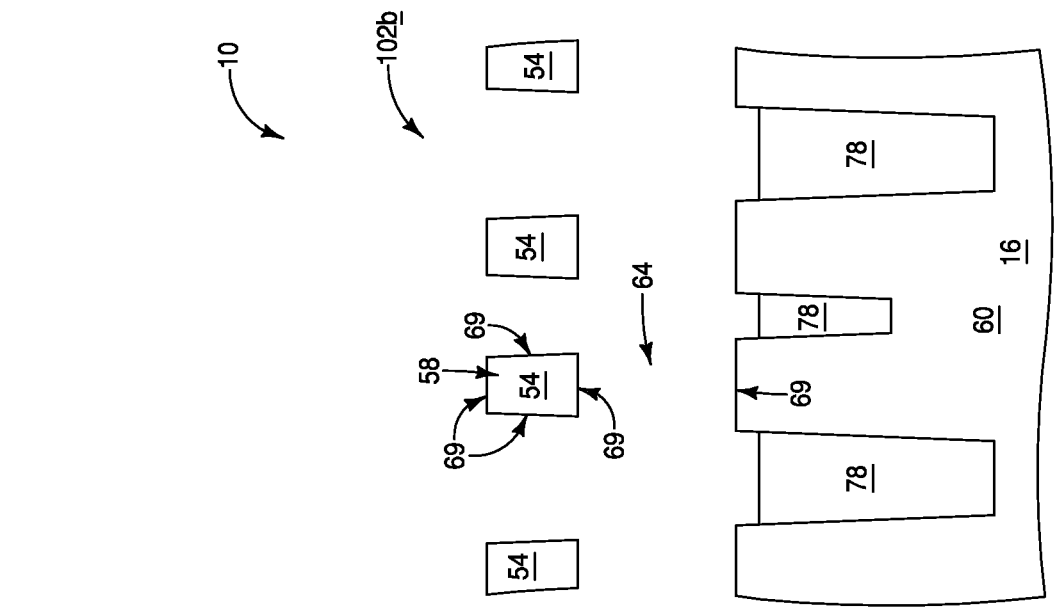
Figure 9A:
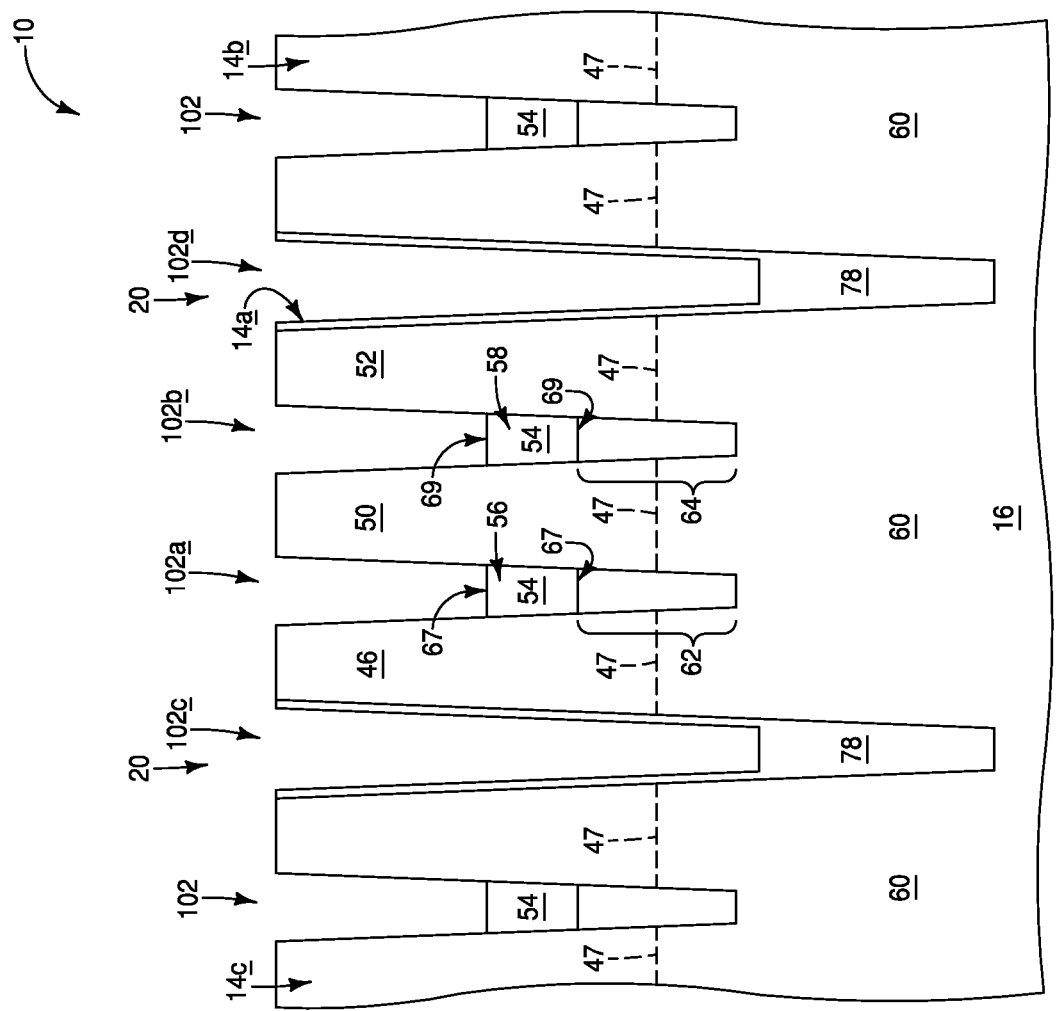

Referring to FIGS. 9A and 9B, the oxides of liners 114 (FIGS. 8A and 8B) and spacers 106 (FIGS. 8A and 8B) are selectively etched relative to the insulative material 78 and the semiconductor materials 16 and 54. Such forms the intervening gaps (e.g., gaps 62 and 64) under the bridges (e.g., bridges 56 and 58).

Referring to FIGS. 10A and 10B, the dielectric material 70 is formed along exposed surfaces of semiconductor materials 16 and 54. The dielectric material 70 may be formed by any suitable processing. For instance, in some embodiments the semiconductor materials 16 and 54 may both comprise silicon, and the dielectric material 70 may comprise silicon dioxide formed by oxidation along upper surfaces of the silicon of some of the materials 16 and 54. As another example, in some embodiments the dielectric material 70 may be deposited onto the surfaces of semiconductor materials 16 and 54.

The dielectric material 70 surrounds the outer peripheries of the bridges (e.g., surrounds the outer peripheries 67 and 69 of the bridges 56 and 58).

Figure 11B:
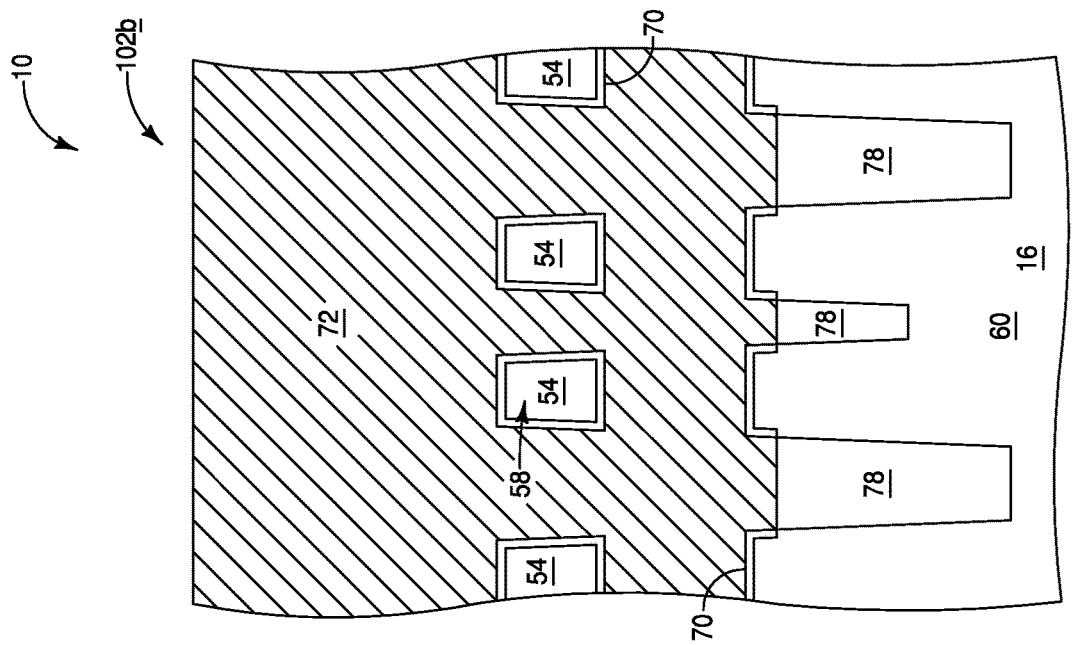
Figure 11A:
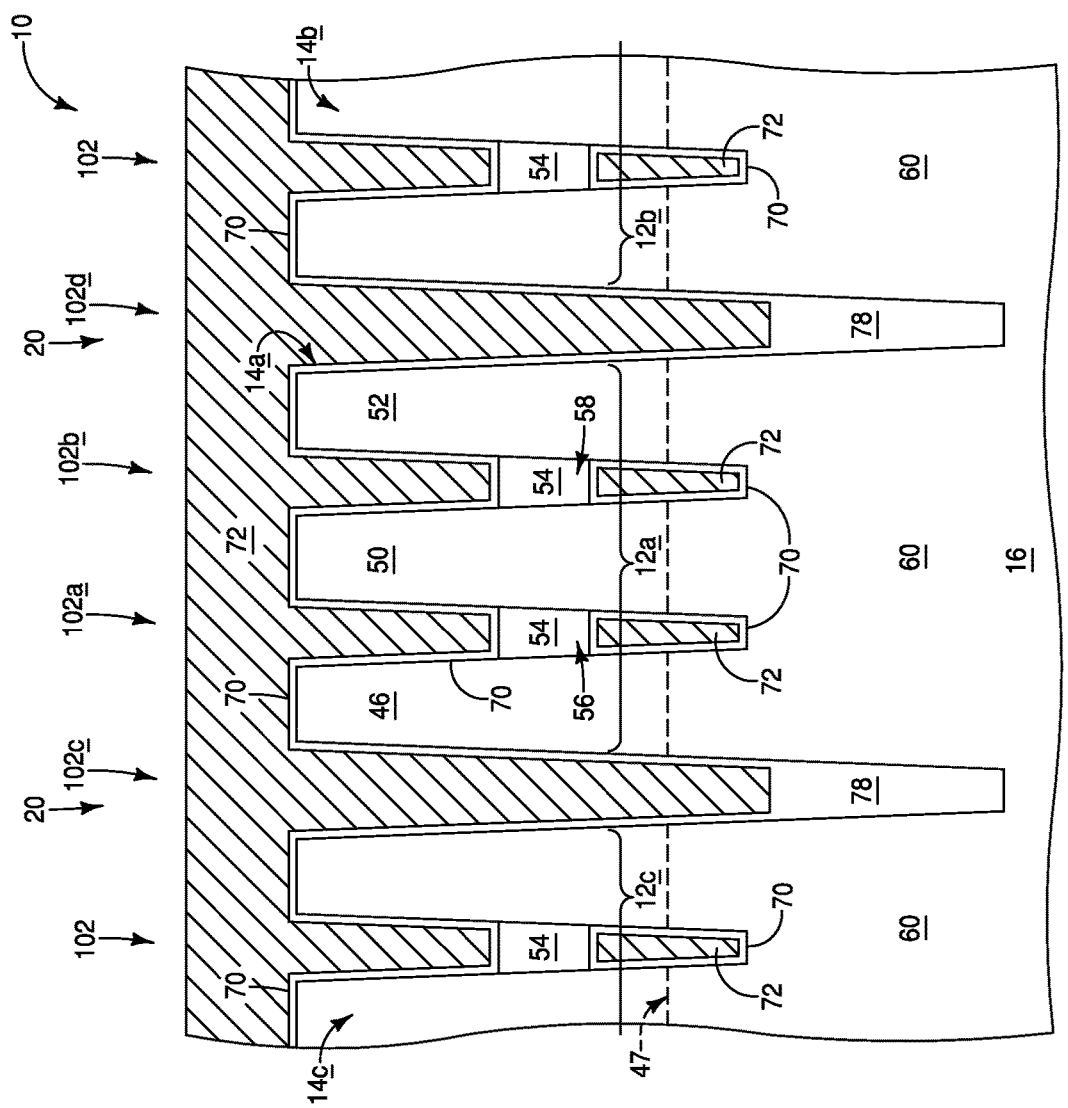

Referring to FIGS. 11A and 11B, wordline material 72 is formed within the trenches 102. The wordline material surrounds the outer peripheries of the bridges 54 within the narrower trenches (e.g., first and second trenches 102a and 102b). The wordline material 72 adjacent the bridge material 54 comprises gates of transistors. The wordline material within the third and fourth trenches 102c and 102d is passing by the active regions 12a, 12b and 12c along the cross-section of FIG. 11A. The third and fourth trenches 102c and 102d are lined with the insulative material 78, and such protects the active regions 12a, 12b and 12c from electrically contacting the wordline material 72 within the third and fourth trenches 102c and 102d. The liners of insulative material 78 are formed within the third and fourth trenches 102c and 102d at the processing stages described above with reference to FIGS. 3A and 4A.

Figure 12B:
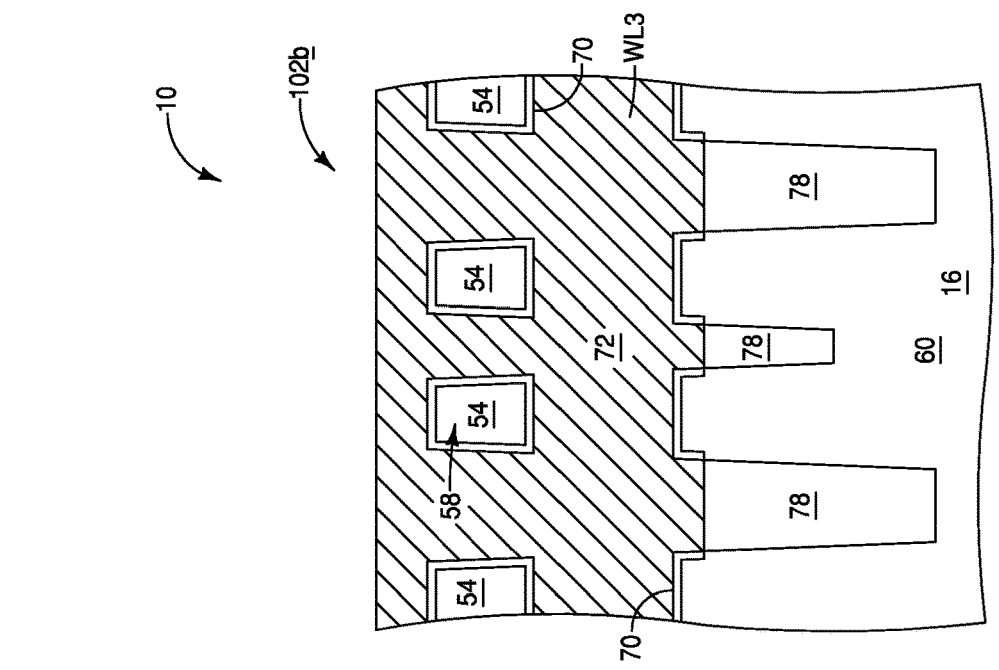
Figure 12A:
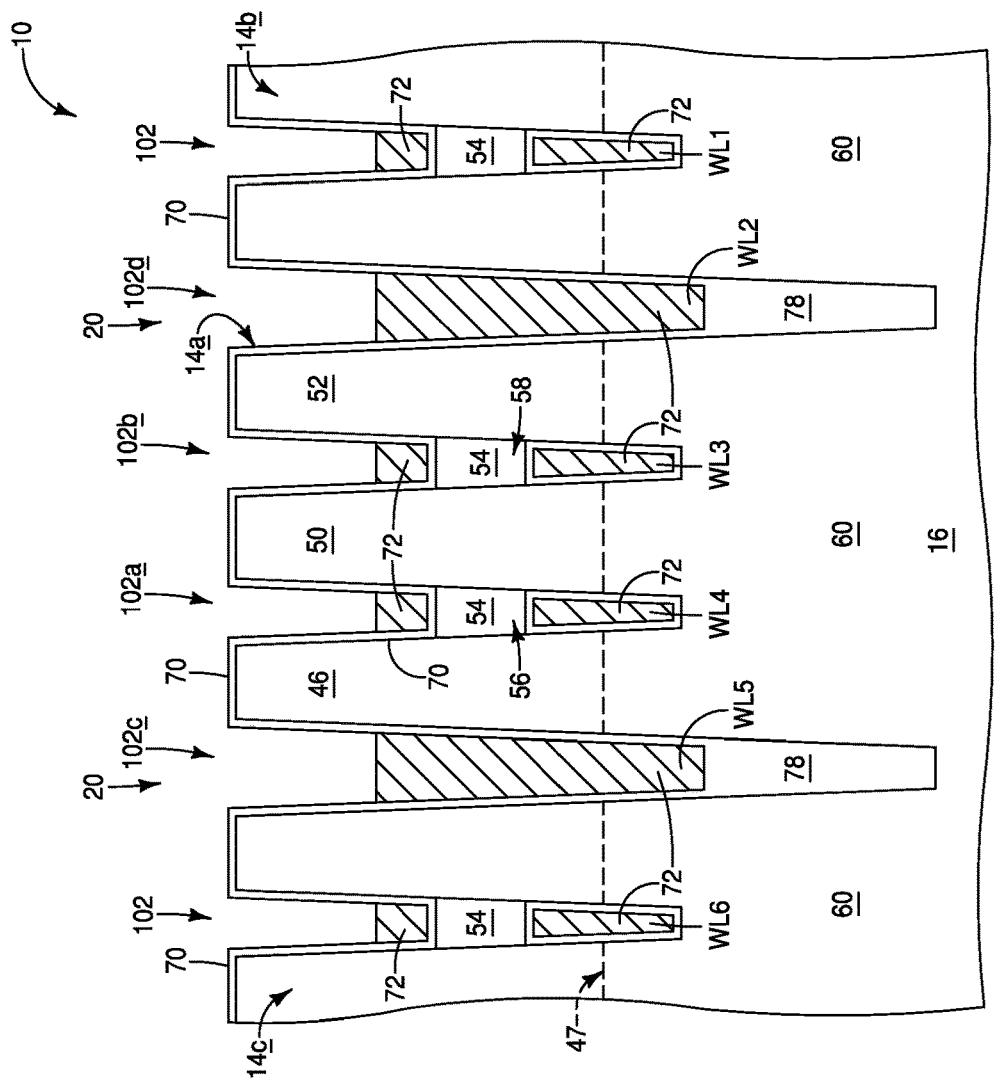

Referring to FIGS. 12A and 12B, the wordline material 72 is recessed within the trenches 102 to form the wordlines WL1-WL6. The recessing of the wordline material 72 may be accomplished with any suitable etch, or combination of etches.

Figure 13B:
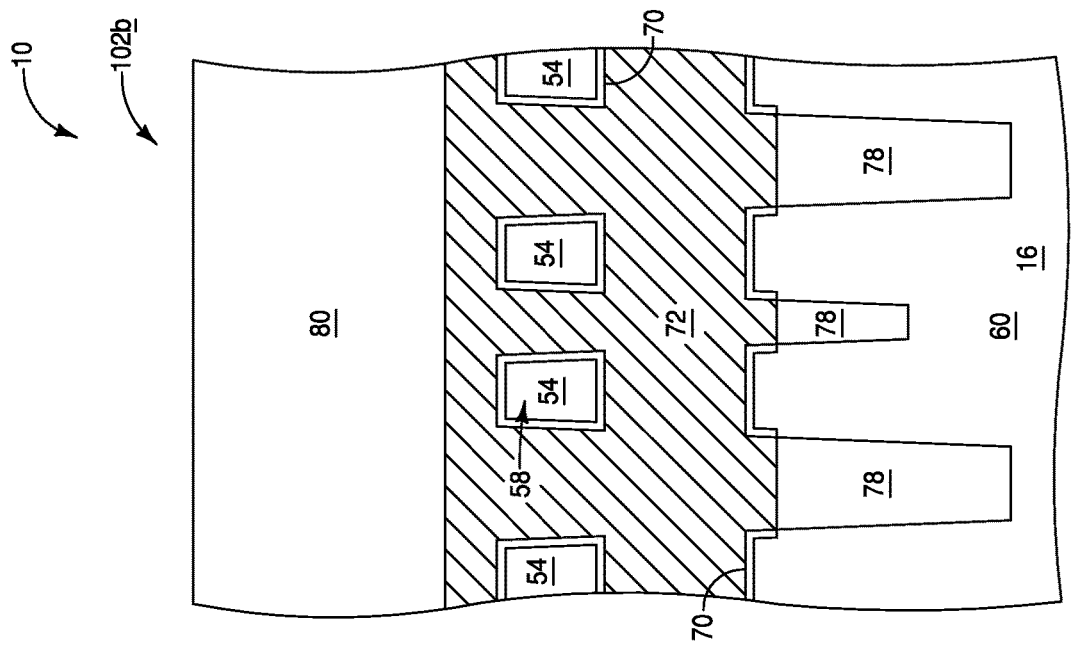
Figure 13A:
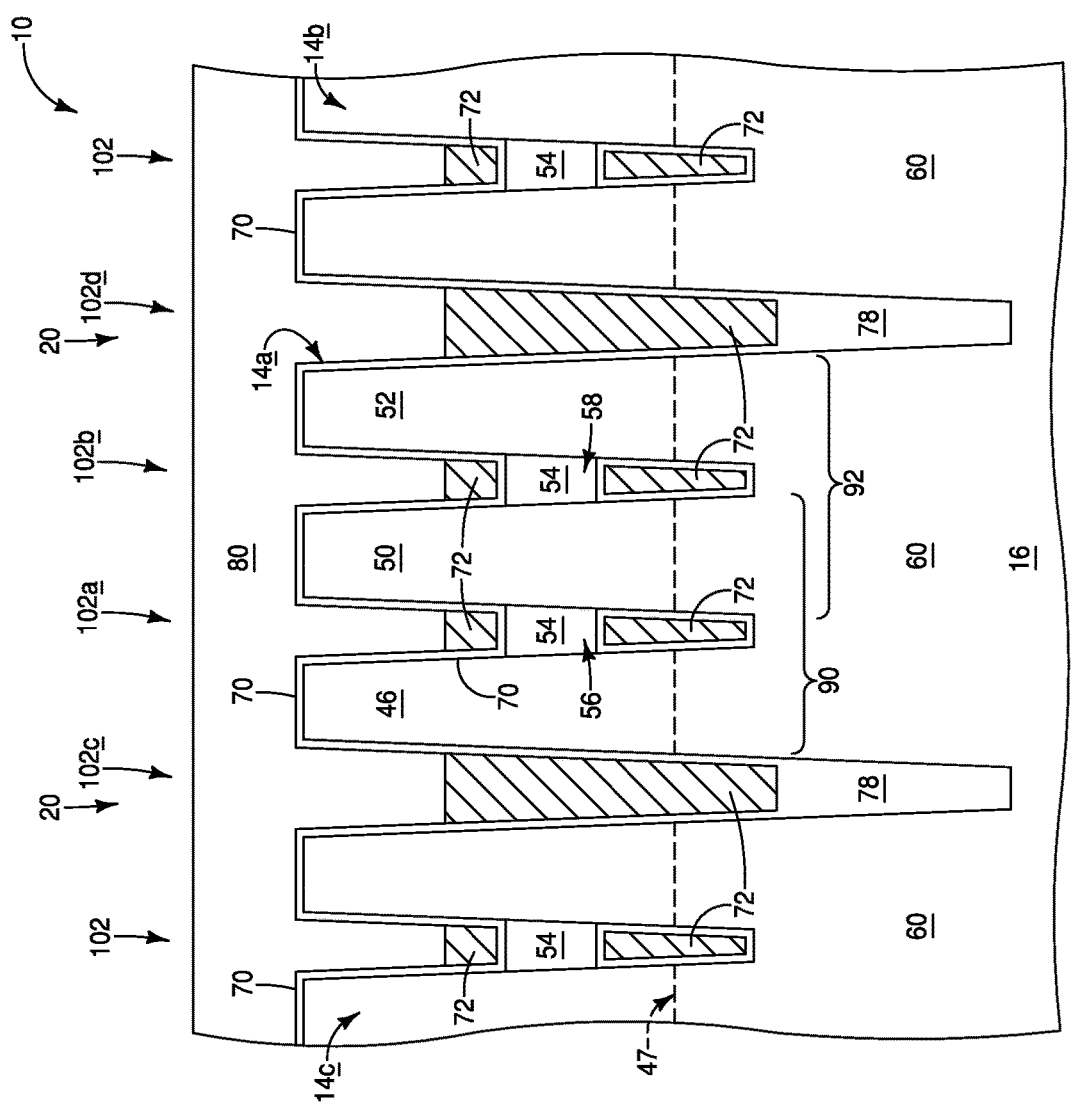
Figure 14:
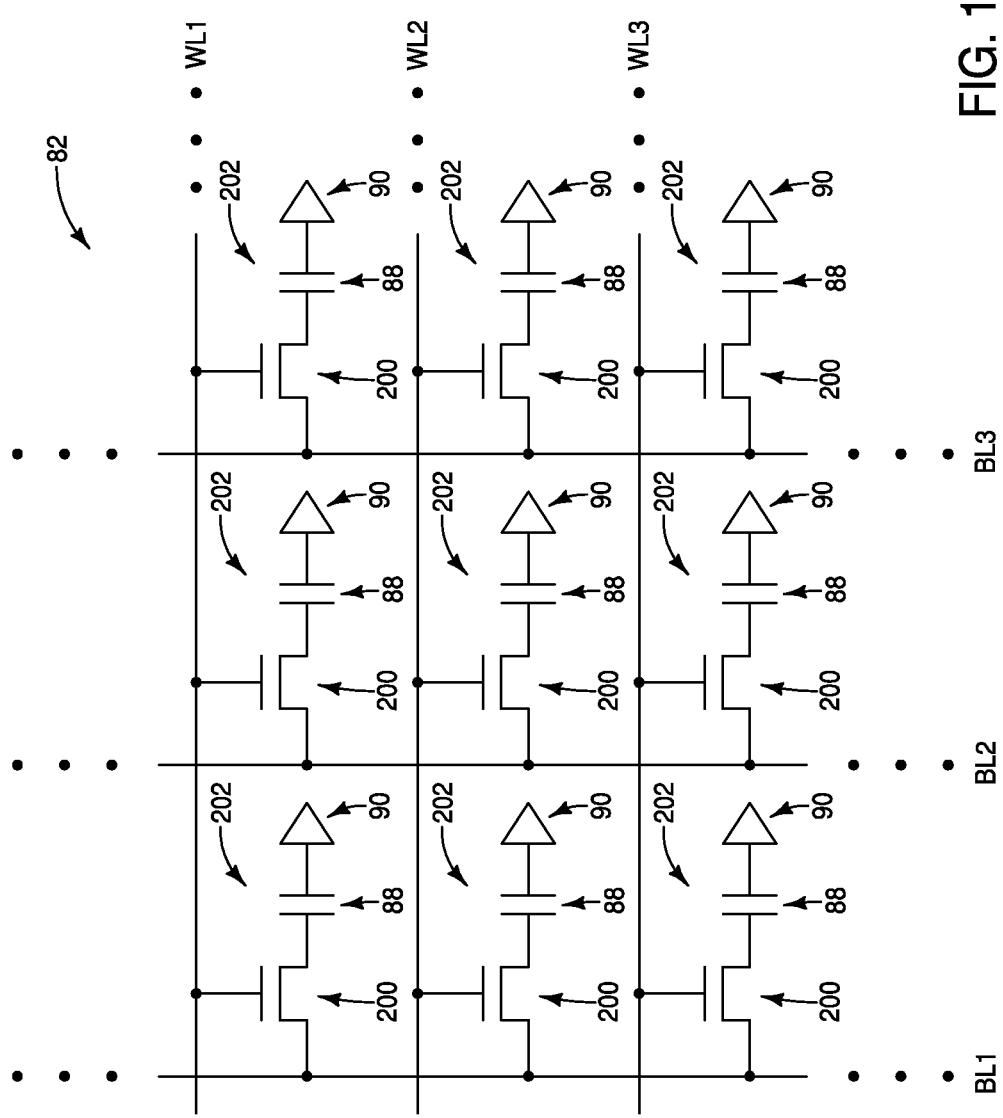
FIG. 14 is a diagrammatic schematic view of an example region of an example memory array.

Referring to FIGS. 13A and 13B, the insulative capping material 80 is formed over the wordline material 72. The assembly 10 of FIGS. 13A and 13B comprises a plurality of access transistors (e.g., the access transistors 90 and 92). Such access transistors may be incorporated into integrated memory, such as, for example, a memory array 82 of the type described above with reference to FIGS. 1-1B. FIG. 14 schematically illustrates a region of the example memory array 82 to assist the reader in understanding an example application for access transistors fabricated in accordance with the methodology described herein.

The memory array comprises the wordlines WL1-WL3 arranged in rows, and the bitlines BL1-BL3 arranged in columns. Memory cells 202 comprise access transistors 200, which correspond to access transistors of the type described herein and exemplified by the access transistors 92 and 94 of FIGS. 13A and 13B. The access transistors 200 have gates coupled with the wordlines, and have source/drain regions coupled with the bitlines. The access transistors also have source/drain regions coupled with the capacitors 88. Each of the memory cells 202 includes an access transistor 200 in combination with a capacitor 88. Each of the memory cells is uniquely addressed through a combination of one of the wordlines with one of the bitlines.

The memory array 82 of FIG. 14 is a DRAM array. The access transistors described herein may be suitable for incorporation into highly integrated DRAM arrays. The access transistors may also have application in other memory arrays. The access transistors may also have application in other integrated circuitry in addition to, or alternatively to, memory arrays.

In some embodiments, it is recognized that the configurations described herein having wordline material entirely surrounding channel-material bridges may advantageously enable transistor devices to be fabricated to ever-increasing levels of integration while maintaining desired operational characteristics of the transistors. For instance, the OFF-current ($I_{OFF}$) of the transistors may retain desired operational parameters, and the ON-current ($I_{ON}$) may also retain desired operational parameters. Such is in contrast to conventional transistor devices in which it is becoming increasingly difficult to maintain desired operational parameters of $I_{OFF}$ and $I_{ON}$ with increasing levels of integration.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first semiconductor material configured to comprise a pair of pedestals. The pedestals have upper regions which are separated from one another by a space, and have lower regions which join to one another at a floor region beneath the space. A second semiconductor material is configured as a bridge extending between the pedestals. The bridge is above the floor region, and is spaced from the floor region by an intervening gap. The bridge has a first end adjacent the first pedestal, a second end adjacent the second pedestal, and body region between the first and second ends. The body region has an outer periphery. A first source/drain region is within one of the pedestals, a second source/drain region is within the other of the pedestals, and a channel region is within the bridge. A dielectric material is outward of the bridge and extends entirely around the outer periphery of the body region of the bridge. A conductive material is outward of the dielectric material and extends entirely around the outer periphery of the body region of the bridge. The conductive material includes a transistor gate which gatedly couples the first and second source/drain regions to one another through the channel region.

Some embodiments include a memory array comprising active regions. Each of the active regions includes a first semiconductor material configured to comprise three pedestals. The pedestals are a first pedestal, a second pedestal and a third pedestal. The first and second pedestals have upper regions separated from one another by a first space, and have lower regions joining to one another at a first floor region beneath the first space. The second and third pedestals have upper regions separated from one another by a second space, and have lower regions joining to one another at a second floor region beneath the second space. First bridges extend between the first and second pedestals. The first bridges are above the first floor regions, and are spaced from the first floor regions by first intervening gaps. The first bridges each have a first body region, and each have a first outer periphery which surrounds the first body region.

Second bridges extend between the second and third pedestals. The second bridges are above the second floor regions, and are spaced from the second floor regions by second intervening gaps. The second bridges each have a second body region, and each have a second outer periphery which surrounds the second body region. First, second and third source/drain regions are within the first, second and third pedestals, respectively, of each of the active regions. The first and second bridges comprise second semiconductor material. First channel regions are within each of the first bridges. Second channel regions are within each of the second bridges. Wordlines have gate regions which extend entirely around the first and second outer peripheries. Charge-storage devices are coupled with the first and third source/drain regions. Bitlines are coupled with the second source/drain regions.

Some embodiments include an integrated assembly comprising a memory cell array. The memory cell array comprises a plurality of buried word lines, a plurality of bit lines and a plurality of memory cells, and each of the plurality of memory cells is coupled to an associated one of the plurality of buried word lines and an associated one of the bit lines. Each of the memory cells comprises an access device that comprises: a pair of source and drain regions; a gate electrode comprising a part of an associated one of the plurality of buried word lines and intervening between the pair of source and drain regions; a hole penetrating through the part of the associated one of the plurality of word lines; and a channel region in the hole coupling the pair of the source and drain regions to each other.

Some embodiments include a method of forming an integrated assembly. A substrate is provided which comprises, along a cross-section, active regions spaced from one another by intervening locations. The cross-section is along a plane which extends along a first direction. Trenches are formed which extend along a second direction, with the second direction crossing the first direction. The trenches include a pair of trenches extending through one of the active regions along the cross-section, and a pair of trenches passing along outer edges of said one of the active regions along the cross-section. The trenches passing through said one of the active regions being first and second trenches, and the trenches passing along the outer edges of said one of the active regions being third and fourth trenches. Spacers are formed along bottom regions of the first and second trenches. Semiconductor material is formed over the spacers and is configured as bridges. The bridges are a first bridge within the first trench and a second bridge within the second trench. The first bridge has a first body region and has a first outer periphery which surrounds the first body region. The second bridge has a second body region and has a second outer periphery which surrounds the second body region. The spacers are removed from under the bridges. Dielectric material is formed to surround the first and second outer peripheries of the first and second bridges. After the dielectric material is formed, wordline material is formed within the first, second, third and fourth trenches. The wordline material within the first and second trenches surrounds the first and second outer peripheries of the first and second bridges.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a first semiconductor material comprising a first pedestal laterally spaced from a second pedestal; and
   a transistor, the transistor comprising:
      a gate comprising a first portion over a second portion;
      a channel comprising a second semiconductor material separating the first portion of the gate from the second portion of the gate; and
      a first source/drain region in the first pedestal and a second source/drain region in the second pedestal.

2. The integrated assembly of claim 1, wherein the first pedestal is coupled to a charge-storage device.

3. The integrated assembly of claim 1, wherein the second pedestal is coupled to a bitline.

4. The integrated assembly of claim 1, wherein the gate surrounds the channel.

5. The integrated assembly of claim 1, wherein the first and second source/drain regions comprise lowermost portions that terminate below the channel.

6. The integrated assembly of claim 1, wherein the first and second source/drain regions comprise lowermost portions that terminate elevationally level with an uppermost portion of the channel.

7. The integrated assembly of claim 1, wherein the first semiconductor material comprises a composition different from a composition of the second semiconductor material.

8. The integrated assembly of claim 1, wherein the first semiconductor material comprises the same composition as the second semiconductor material.

9. The integrated assembly of claim 1, wherein the first and second source/drain regions comprise lowermost portions that terminate above the second portion of the gate.

10. The integrated assembly of claim 1, wherein periphery portions of the channel contact the first and second pedestals.

11. An integrated assembly comprising a memory cell array,
   wherein the memory cell array comprises a plurality of buried wordlines, a plurality of bitlines and a plurality of memory cells, each of the plurality of memory cells being coupled to an associated one of the plurality of buried wordlines and an associated one of the bitlines and comprising an access device, wherein the access device comprises:
      a pair of source/drain regions;
      a gate electrode comprising a part of an associated one of the plurality of buried wordlines and intervening between the pair of source/drain regions;
      a hole penetrating through the gate electrode separating a first portion of the gate electrode elevationally over a second portion of the gate electrode; and
      a channel region in the hole coupling the pair of the source/drain regions to each other.

12. The integrated assembly of claim 11, wherein each of the memory cells further comprises a capacitor, the capacitor being coupled to one of the pair of source/drain regions, and the other of the pair of source/drain regions being coupled to an associated one of the plurality of bitlines.

13. The integrated assembly of claim 11, wherein each of the pair of source/drain regions projects from semiconductor base material, and wherein the channel region extends horizontally to couple the pair of source/drain regions to one another.

14. The integrated assembly of claim 13, wherein the channel region is surrounded completely by the part of the associated one of the plurality of buried wordlines and is isolated therefrom by gate dielectric material.

* * * * *